(12) United States Patent
Nam et al.

(10) Patent No.: US 12,501,548 B2
(45) Date of Patent: Dec. 16, 2025

(54) PACKAGE SUBSTRATE

(71) Applicant: LG INNOTEK CO., LTD., Seoul (KR)

(72) Inventors: Il Sik Nam, Seoul (KR); Dong Keun Lee, Seoul (KR); Hye Jin Jo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 190 days.

(21) Appl. No.: 17/927,797

(22) PCT Filed: May 26, 2021

(86) PCT No.: PCT/KR2021/006562
§ 371 (c)(1),
(2) Date: Nov. 25, 2022

(87) PCT Pub. No.: WO2021/242012
PCT Pub. Date: Dec. 2, 2021

(65) Prior Publication Data
US 2023/0217593 A1  Jul. 6, 2023

(30) Foreign Application Priority Data

May 26, 2020  (KR) .................. 10-2020-0063010
Jun. 10, 2020  (KR) .................. 10-2020-0070534

(51) Int. Cl.
*H05K 1/11* (2006.01)
*H01L 21/48* (2006.01)
(Continued)

(52) U.S. Cl.
CPC ............ *H05K 1/115* (2013.01); *H01L 21/486* (2013.01); *H01L 23/49827* (2013.01);
(Continued)

(58) Field of Classification Search
CPC .................. H05K 1/111–113; H05K 1/181
See application file for complete search history.

(56) References Cited

U.S. PATENT DOCUMENTS 8,785,788 B2  7/2014  Shimizu et al.
10,398,038 B2  8/2019  Kajihara et al.
(Continued)

FOREIGN PATENT DOCUMENTS

JP   2011-103432   5/2011
JP   2012-164952   8/2012
(Continued)

OTHER PUBLICATIONS

International Search Report dated Sep. 27, 2021 issued in Application No. PCT/KR2021/006562.
(Continued)

*Primary Examiner* — Timothy J Thompson
(74) *Attorney, Agent, or Firm* — KED & ASSOCIATES, LLP

(57) ABSTRACT

A package substrate according to an embodiment includes an insulating layer; a first outer circuit pattern disposed on an upper surface of the insulating layer; a second outer circuit pattern disposed under a lower surface of the insulating layer; a first connection portion disposed on an upper surface of a first-first circuit pattern of the first outer circuit pattern; a first contact portion disposed on the first connection portion; a first device disposed on the first connection portion through the first contact portion; a second contact portion disposed under a lower surface of a second-first circuit pattern of the second outer circuit pattern; a second device attached to the second-first circuit pattern through the second contact portion; and a second connection portion disposed under a lower surface of a second-second circuit pattern of the second outer circuit pattern; wherein the first connection portion is disposed with a first width and a first interval, and wherein the second connection portion is disposed with a second width greater than the first width and a second interval greater than the first interval.

18 Claims, 17 Drawing Sheets

(51) Int. Cl.
    *H01L 23/00*     (2006.01)
    *H01L 23/498*     (2006.01)
    *H05K 1/02*     (2006.01)
    *H05K 1/18*     (2006.01)
    *H05K 3/34*     (2006.01)
    *H05K 3/40*     (2006.01)
    *H05K 3/46*     (2006.01)

(52) U.S. Cl.
    CPC .............. *H01L 24/11* (2013.01); *H01L 24/16* (2013.01); *H01L 24/81* (2013.01); *H05K 1/0271* (2013.01); *H05K 1/186* (2013.01); *H05K 3/3415* (2013.01); *H05K 3/4007* (2013.01); *H05K 3/4697* (2013.01); *H01L 2224/11462* (2013.01); *H01L 2224/11912* (2013.01); *H01L 2224/16227* (2013.01); *H01L 2224/81192* (2013.01); *H01L 2224/81815* (2013.01); *H05K 2201/10015* (2013.01); *H05K 2201/10022* (2013.01); *H05K 2201/1003* (2013.01); *H05K 2201/10166* (2013.01); *H05K 2201/10545* (2013.01); *H05K 2203/0723* (2013.01)

(56) References Cited

U.S. PATENT DOCUMENTS

| | | |
|---|---|---|
| 11,039,536 B2 | 6/2021 | Jung et al. |
| 2008/0179740 A1 | 7/2008 | Liao |
| 2011/0110058 A1 | 5/2011 | Kim et al. |
| 2012/0186861 A1 | 7/2012 | Shimizu et al. |
| 2012/0244662 A1 | 9/2012 | Kim et al. |
| 2013/0153280 A1 | 6/2013 | Kim et al. |
| 2015/0098204 A1* | 4/2015 | Yoshikawa ............. H01L 23/00 361/767 |
| 2015/0235915 A1 | 8/2015 | Liang et al. |
| 2015/0382463 A1* | 12/2015 | Kim .................... H05K 3/4007 29/829 |
| 2016/0351506 A1* | 12/2016 | Kim .................... H01L 21/4857 |
| 2018/0116057 A1 | 4/2018 | Kajihara et al. |
| 2018/0254238 A1 | 9/2018 | Tsai et al. |
| 2018/0350626 A1 | 12/2018 | Chen et al. |

FOREIGN PATENT DOCUMENTS

| | | |
|---|---|---|
| JP | 2017-174953 | 9/2017 |
| JP | 2018-073890 | 5/2018 |
| KR | 10-2013-0070129 | 6/2013 |
| KR | 10-2015-0017959 | 2/2015 |
| KR | 10-2016-0084666 | 7/2016 |
| KR | 10-2019-0115911 | 10/2019 |
| KR | 10-2020-0015974 | 2/2020 |

OTHER PUBLICATIONS

European Search Report dated Jun. 7, 2024 issued in Application No. 21812665.4.
Korean Office Action dated Dec. 9, 2024 issued in Application No. 10-2020-0070534.
Japanese Office Action dated Feb. 25, 2025 issued in Application No. 2022-573339.
Korean Office Action dated Aug. 20, 2025, issued in Application No. 10-2020-0070534.

* cited by examiner

[FIG. 1]
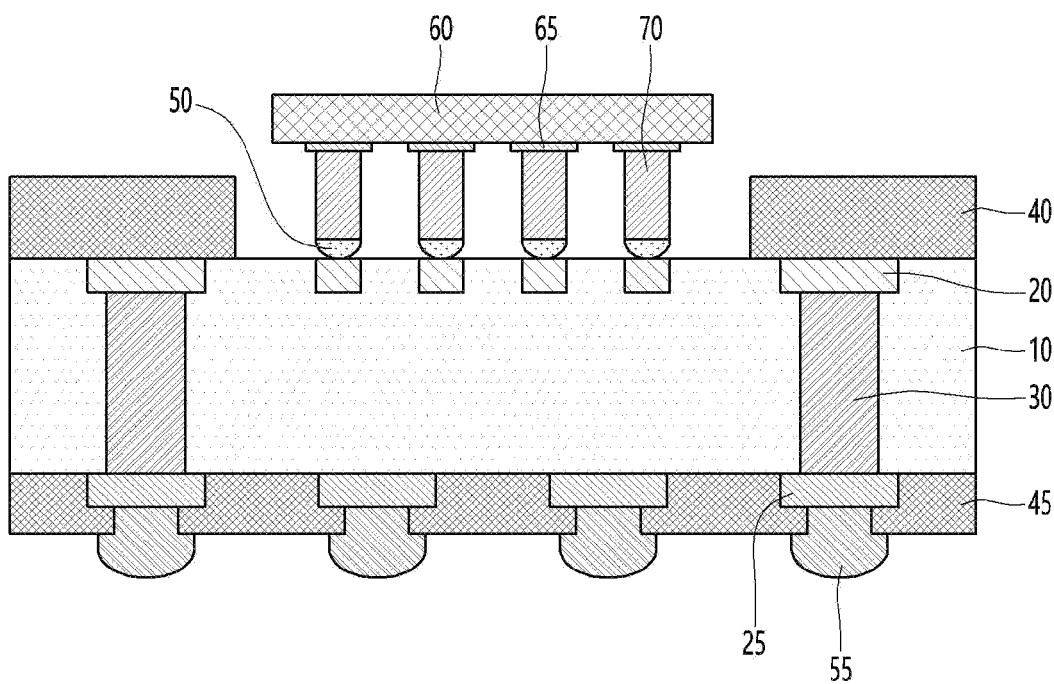

[FIG. 2]
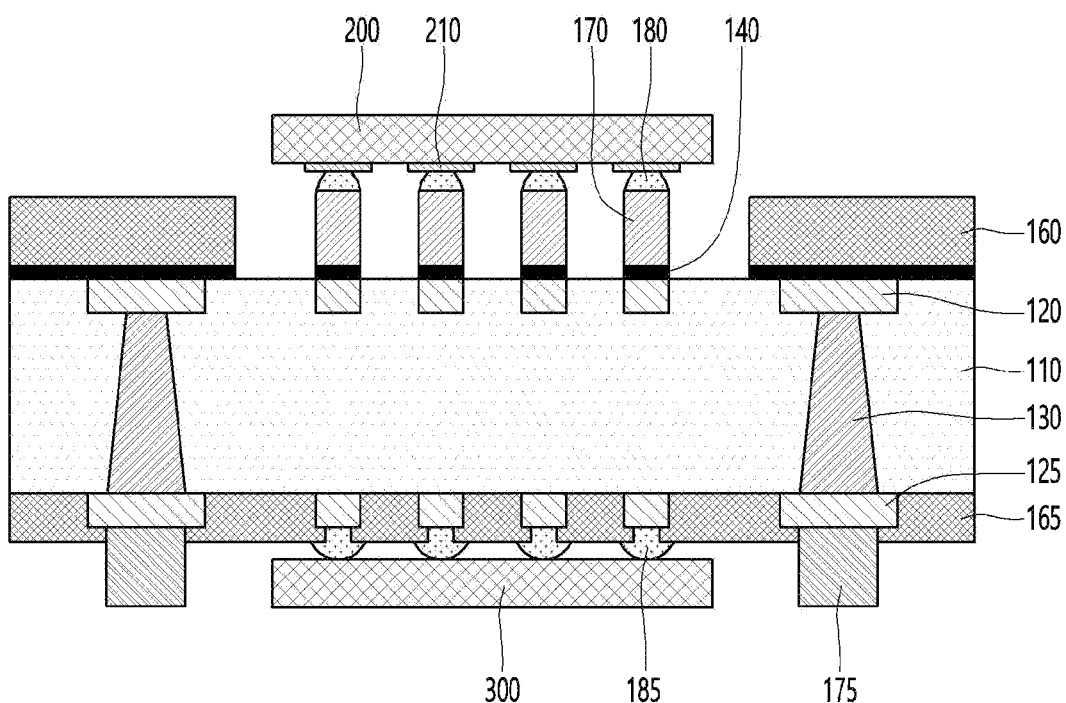

[FIG. 3]
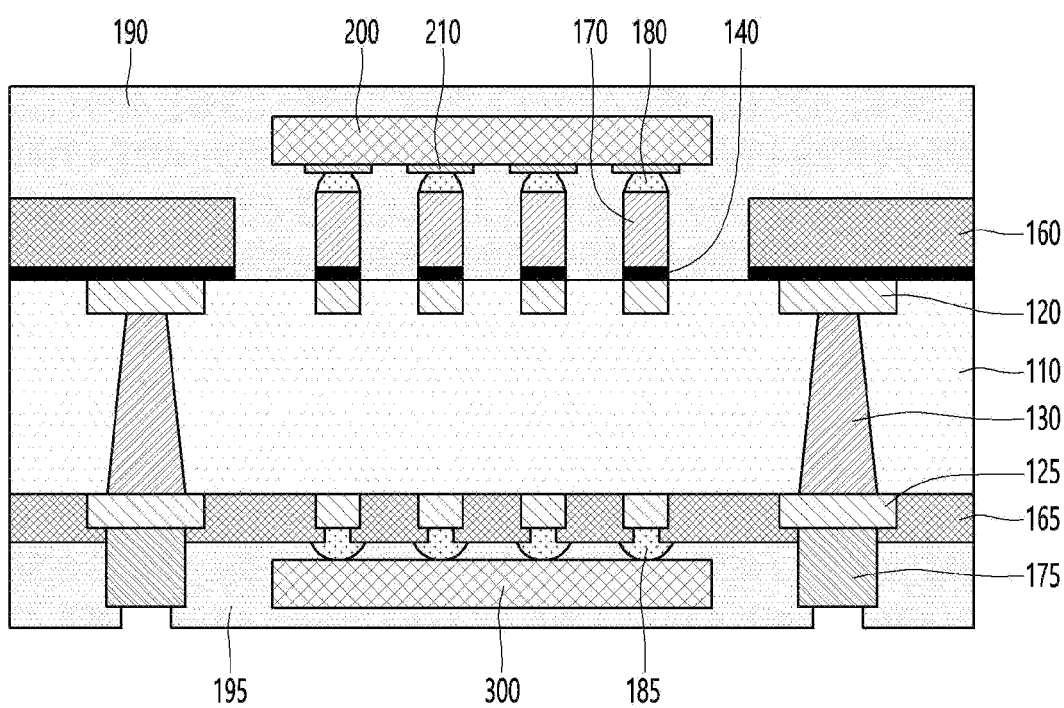

【FIG. 4】
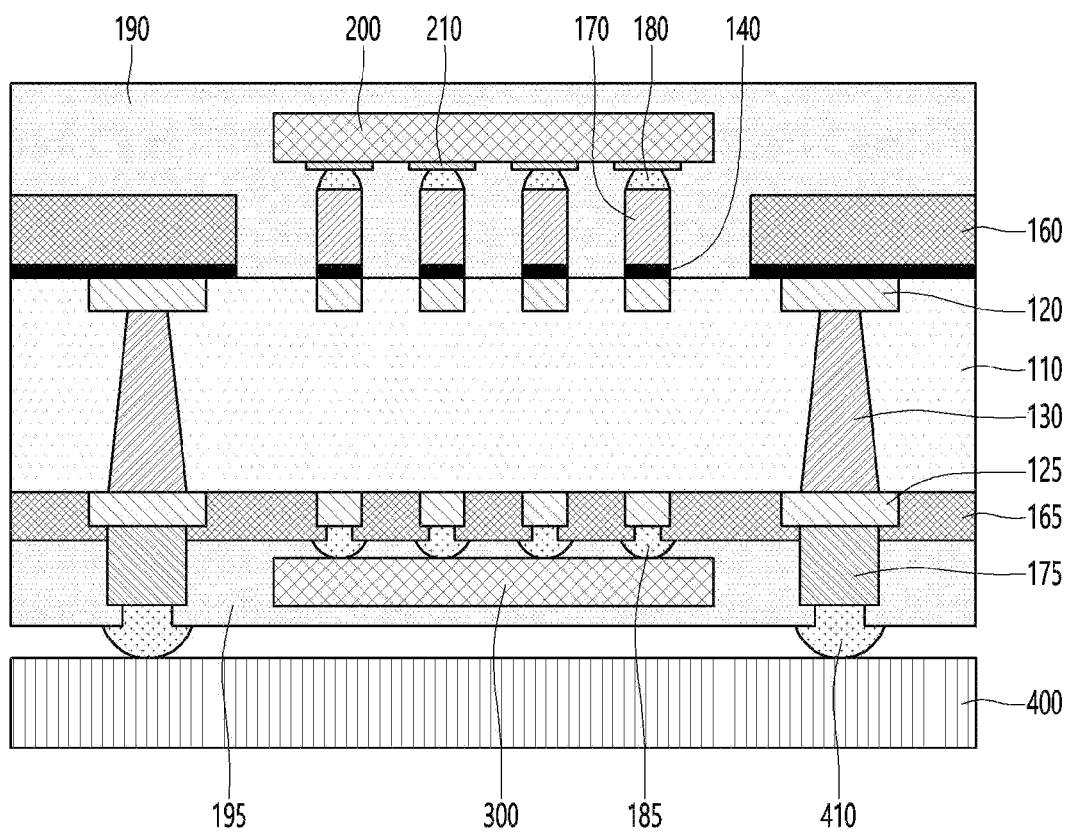
【FIG. 5】
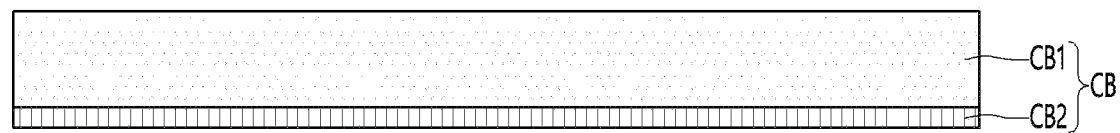

[FIG. 6]
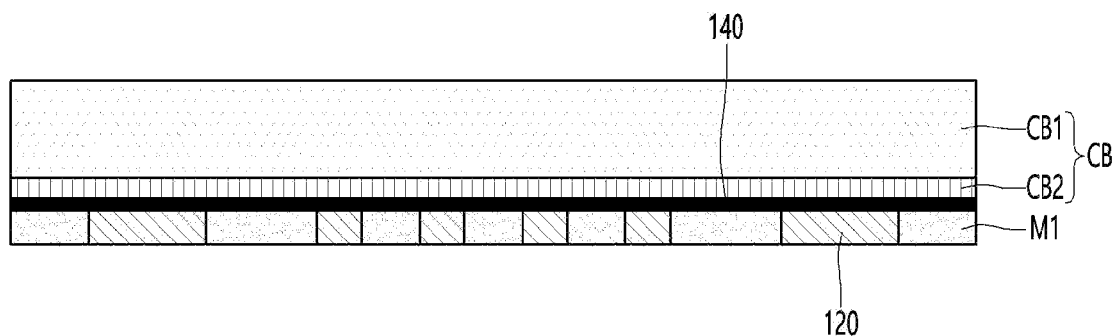
[FIG. 7]
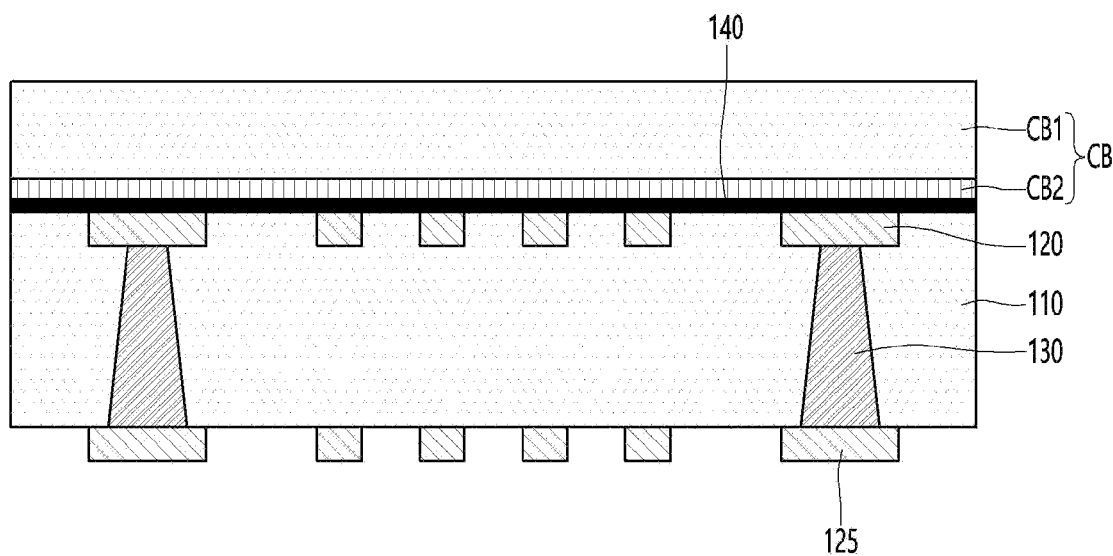

[FIG. 8]
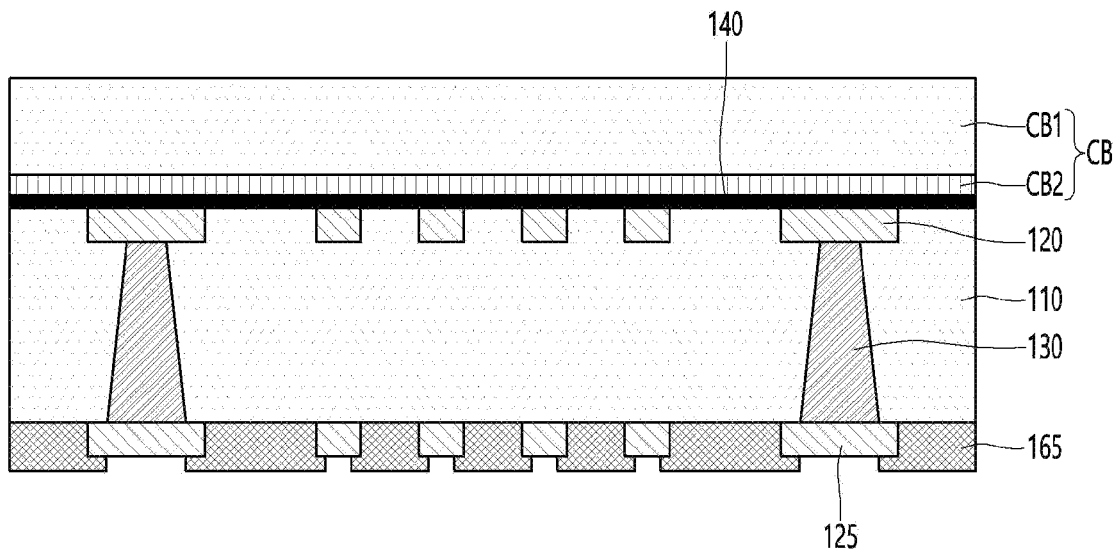
[FIG. 9]
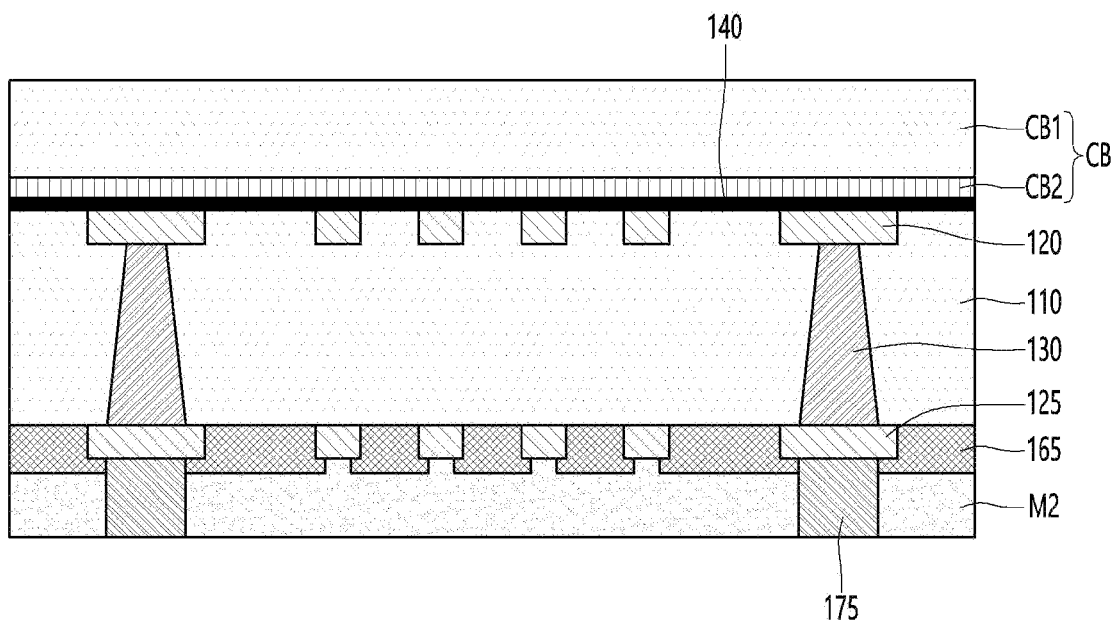

【FIG. 10】
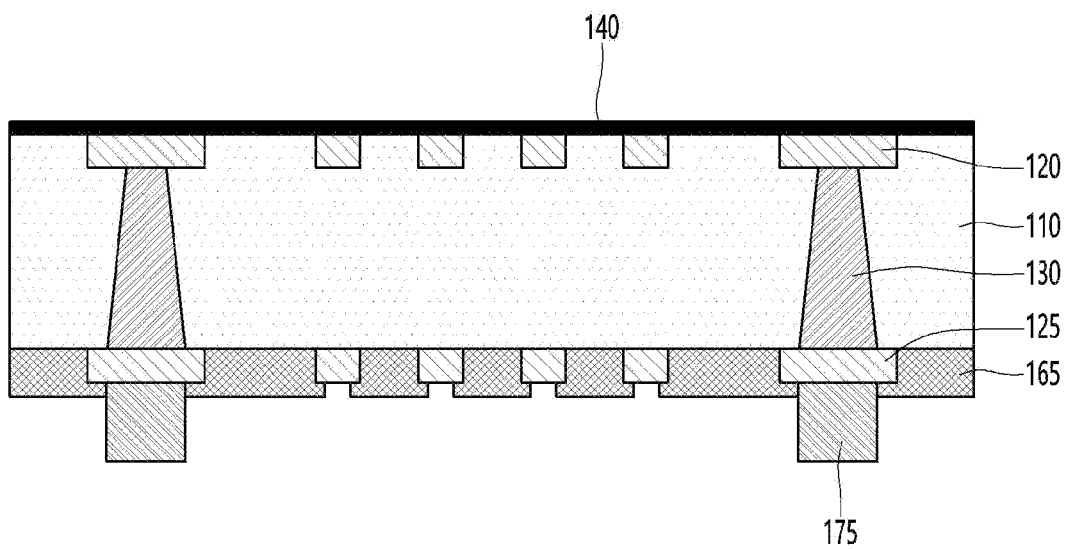
【FIG. 11】
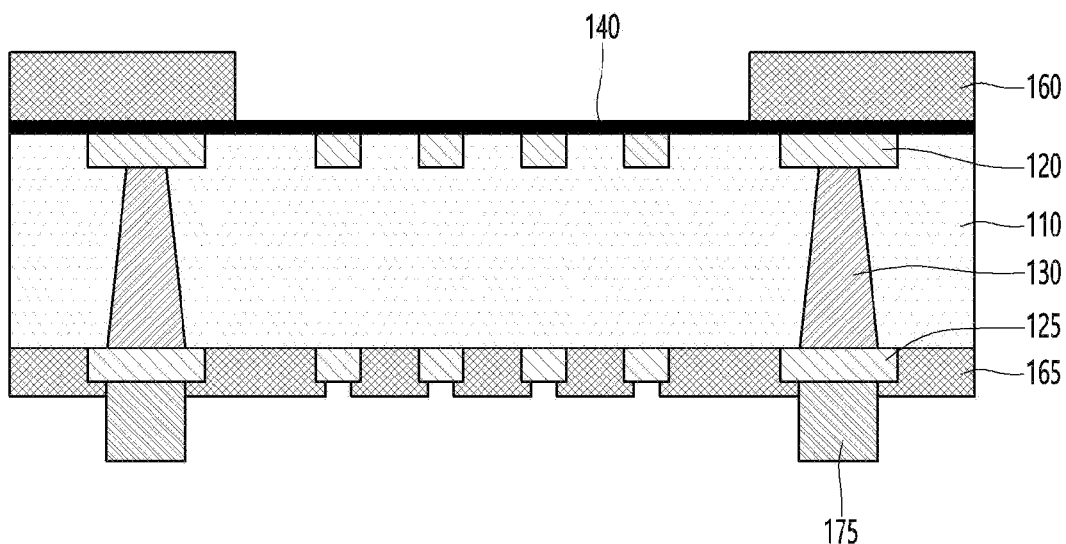

【FIG. 12】
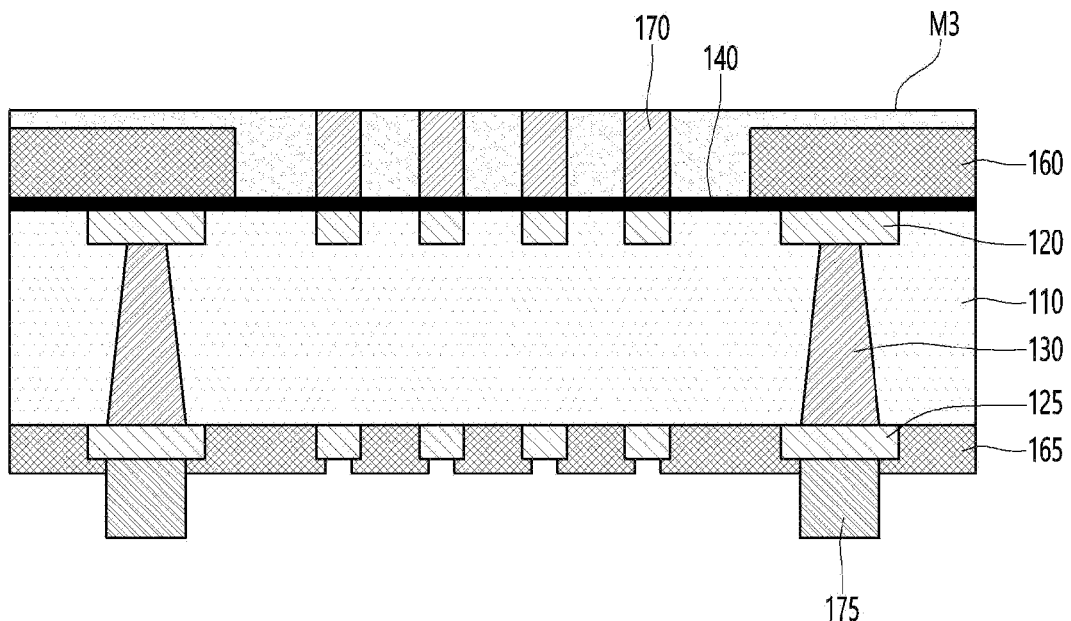
【FIG. 13】
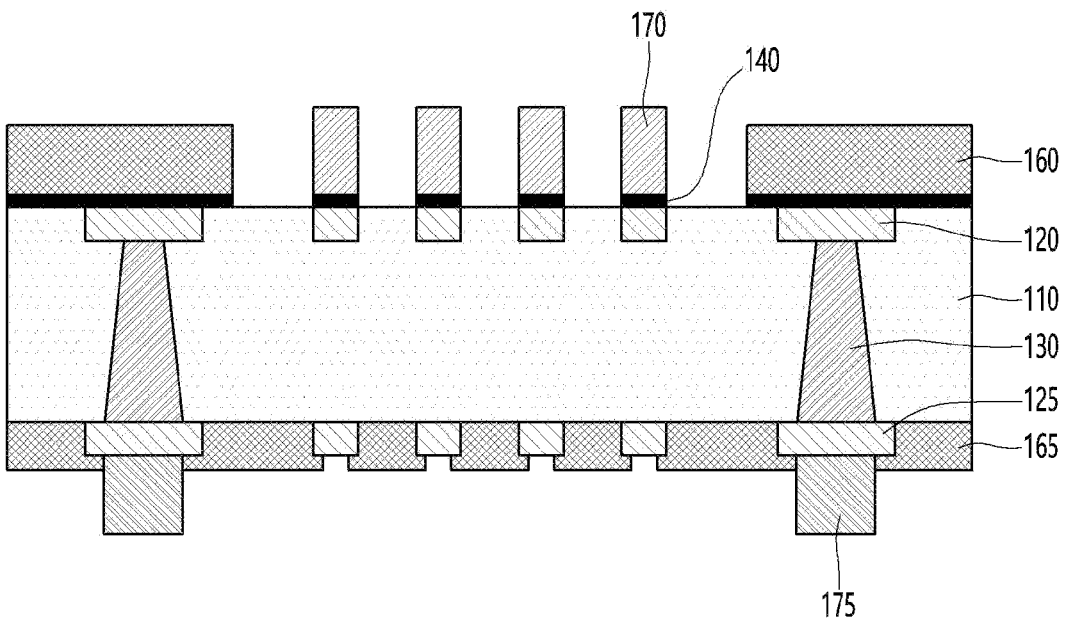

[FIG. 14]
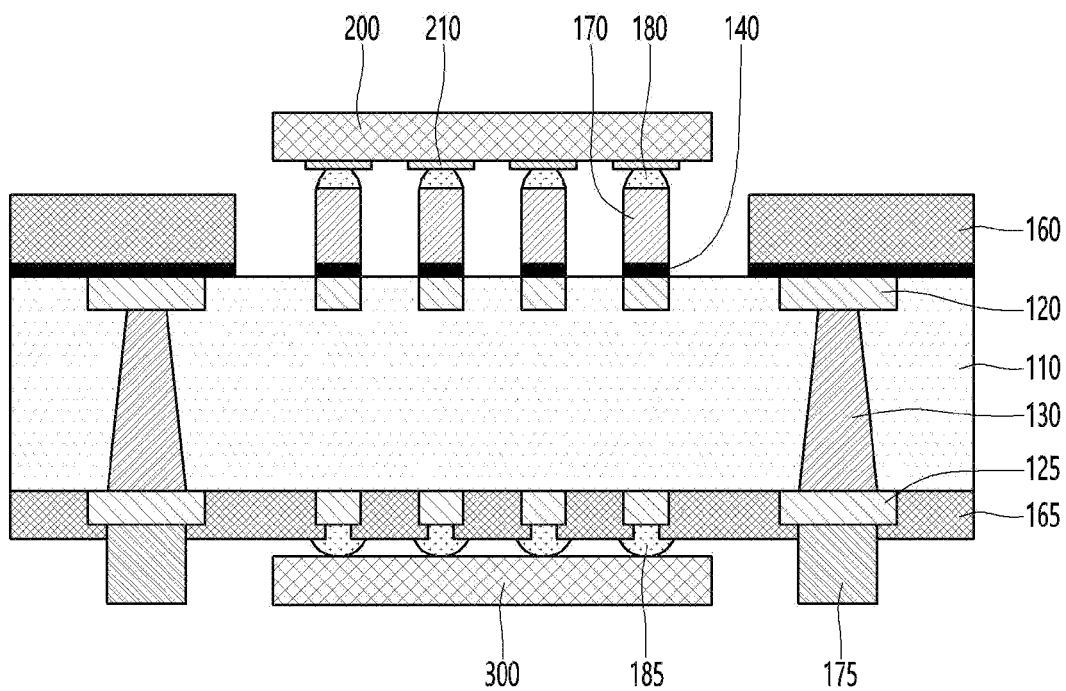

[FIG. 15]
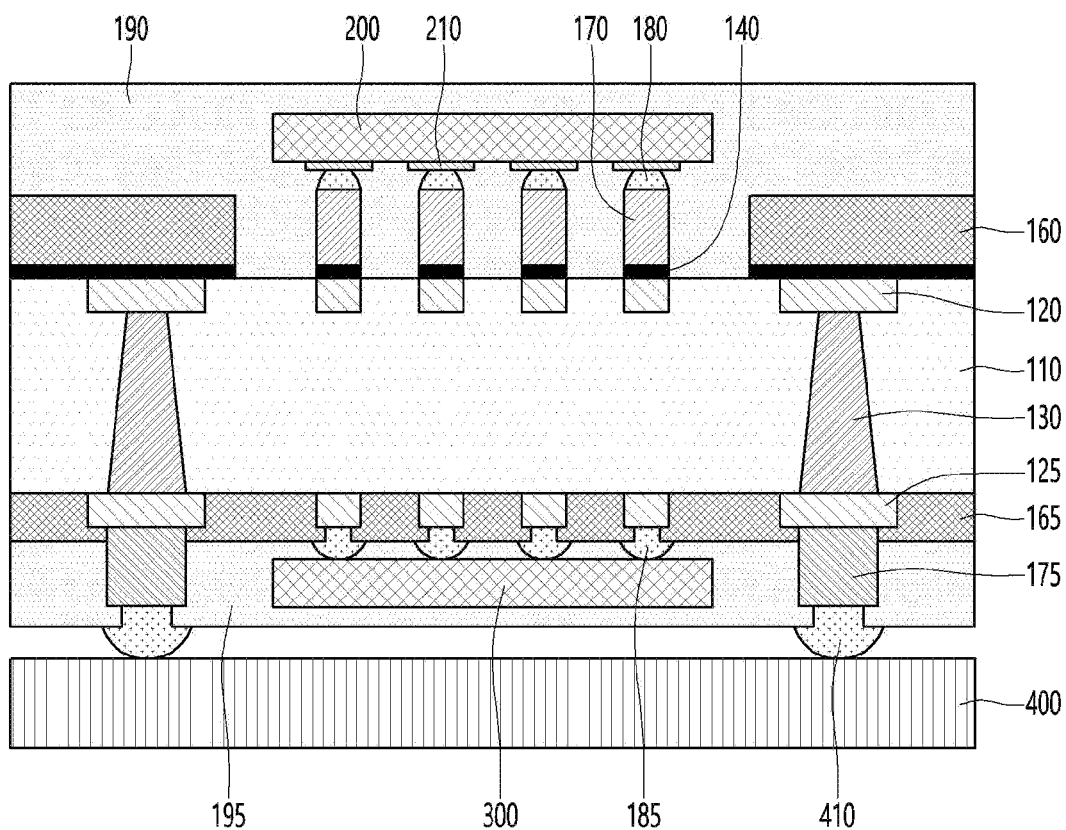

【FIG. 16】
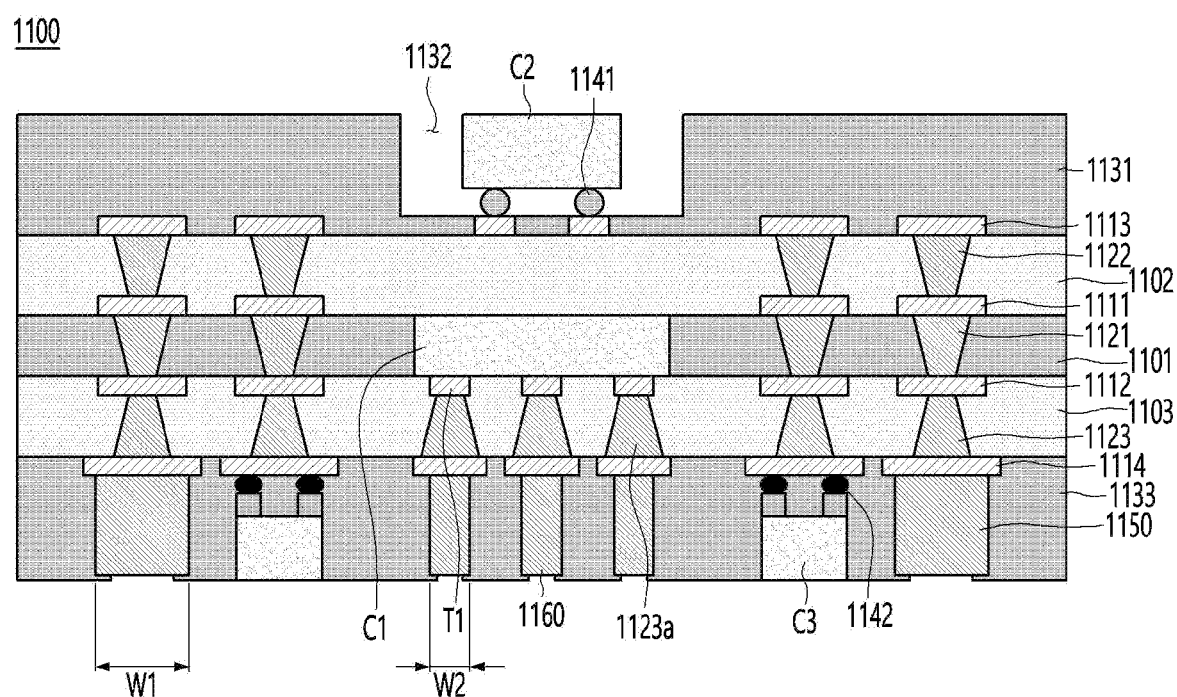
【FIG. 17A】
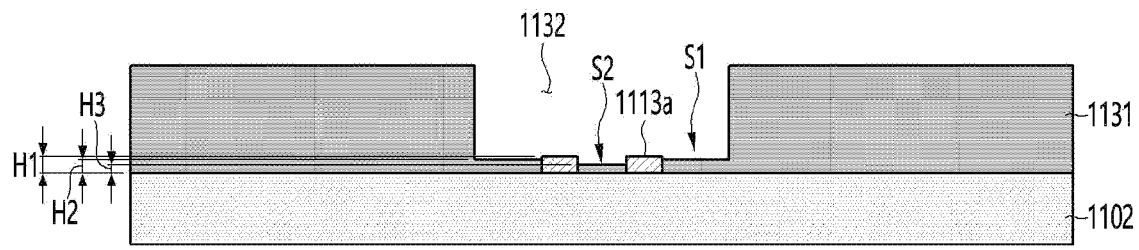

[FIG. 17B]
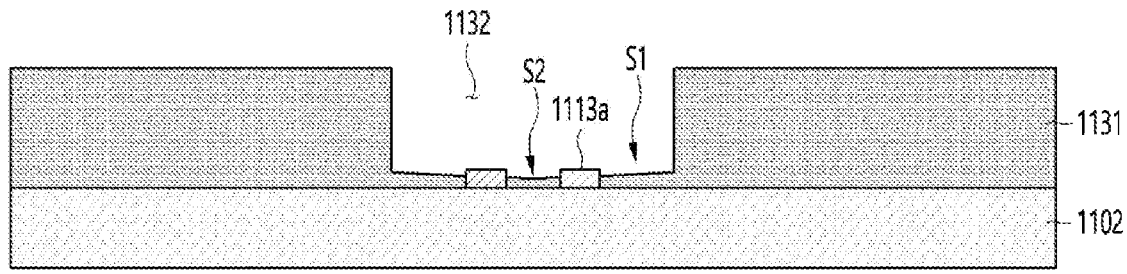
[FIG. 18]
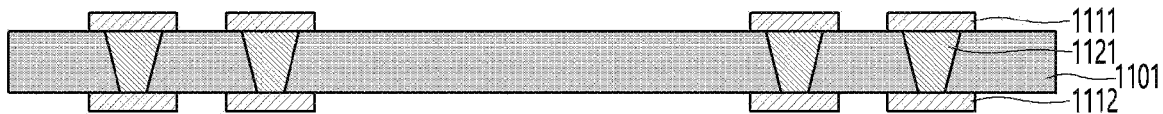
[FIG. 19]
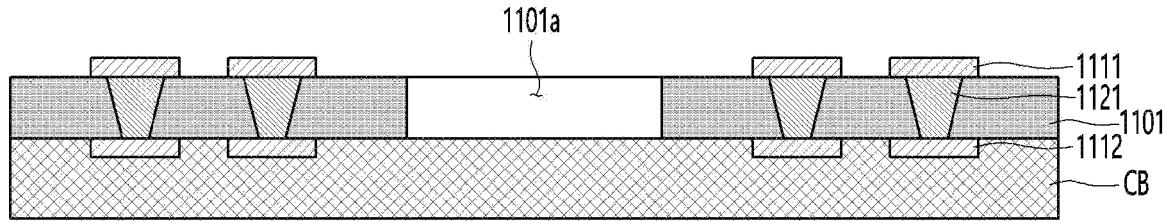
[FIG. 20]
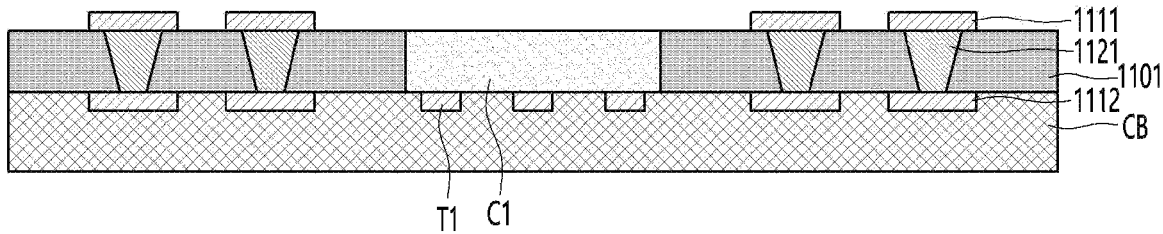

[FIG. 21]
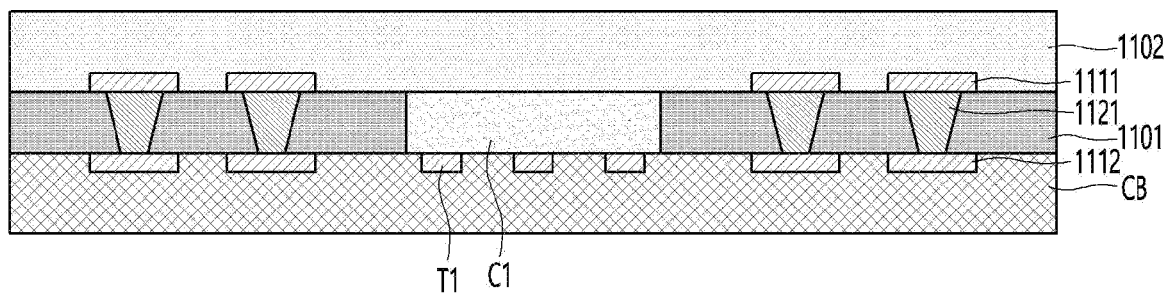
[FIG. 22]
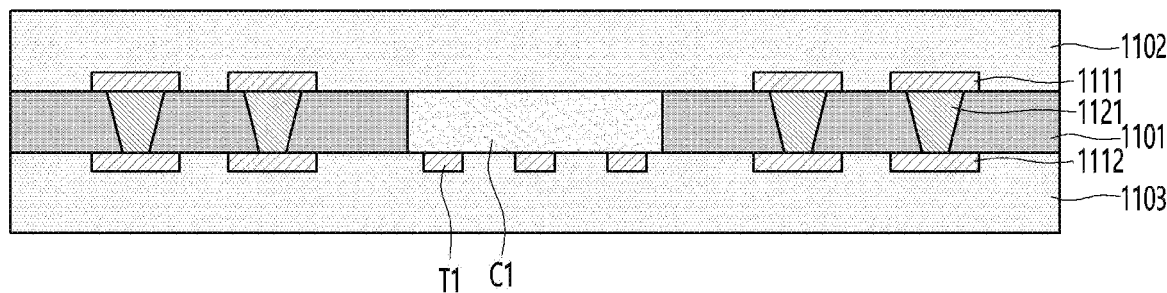
[FIG. 23]
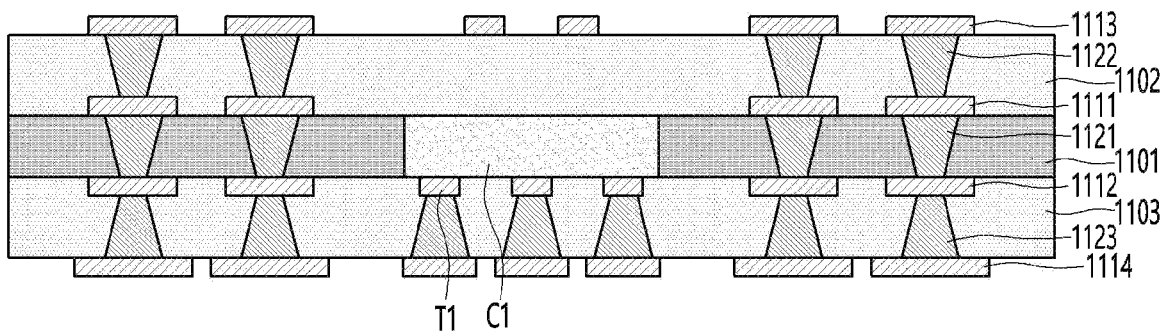

[FIG. 24]
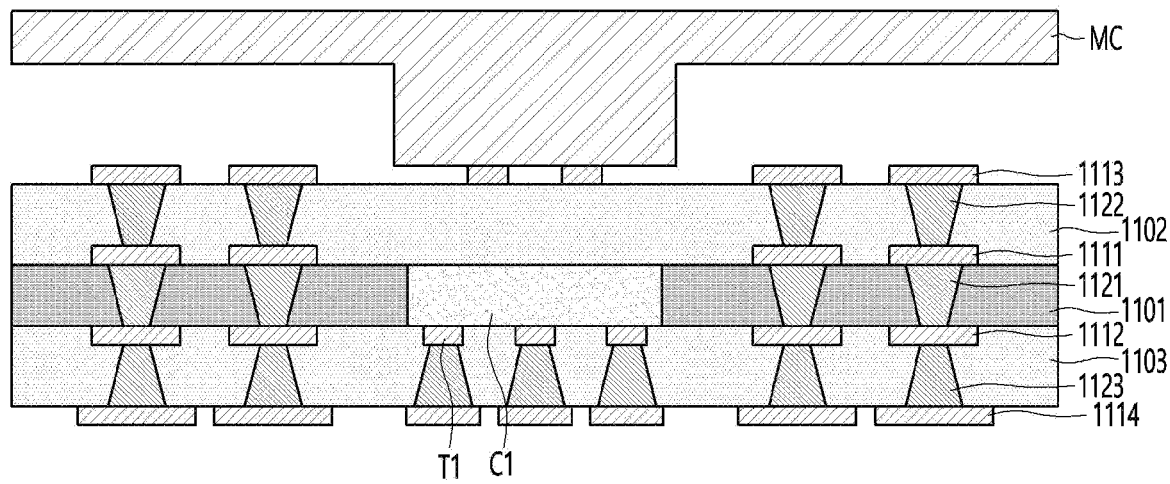
[FIG. 25]
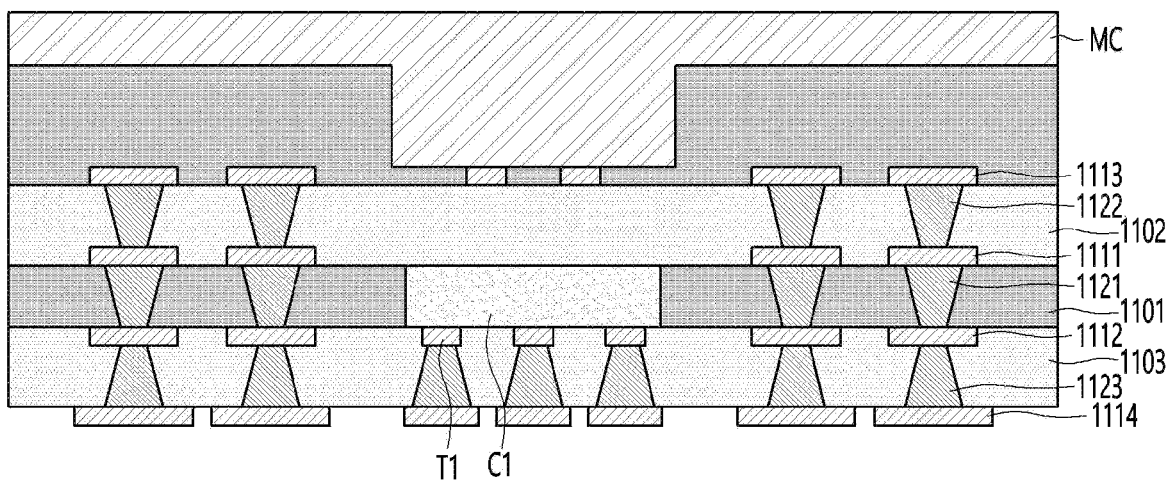

[FIG. 26]
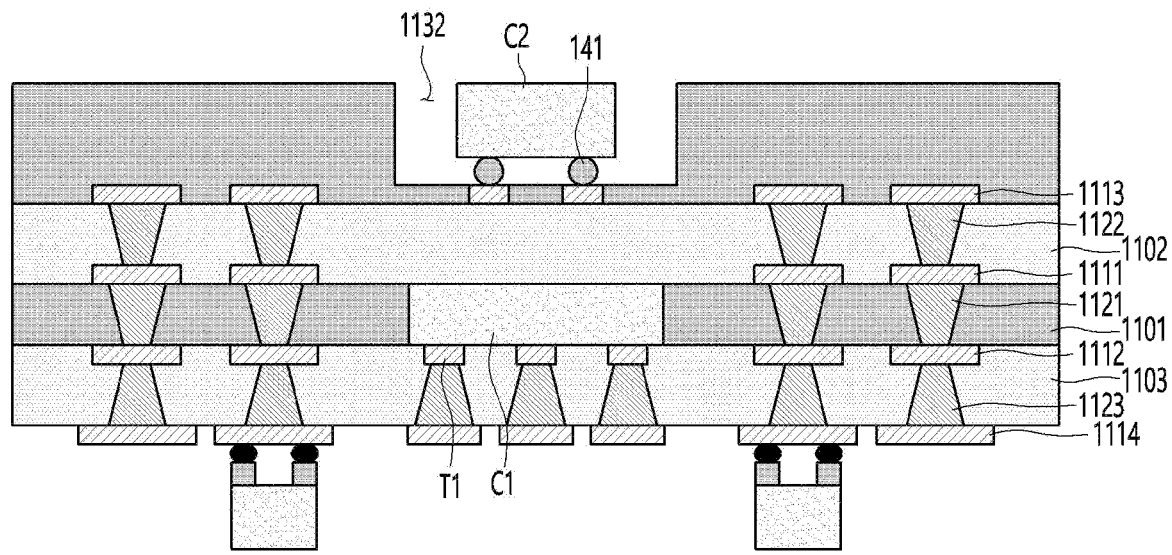
[FIG. 27]
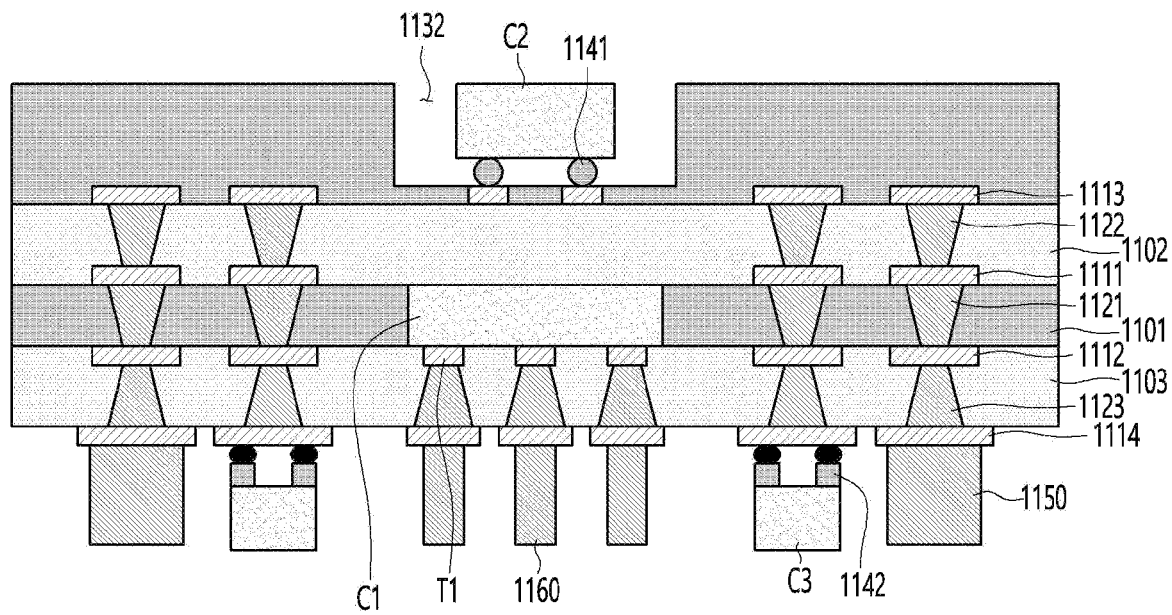

[FIG. 28]
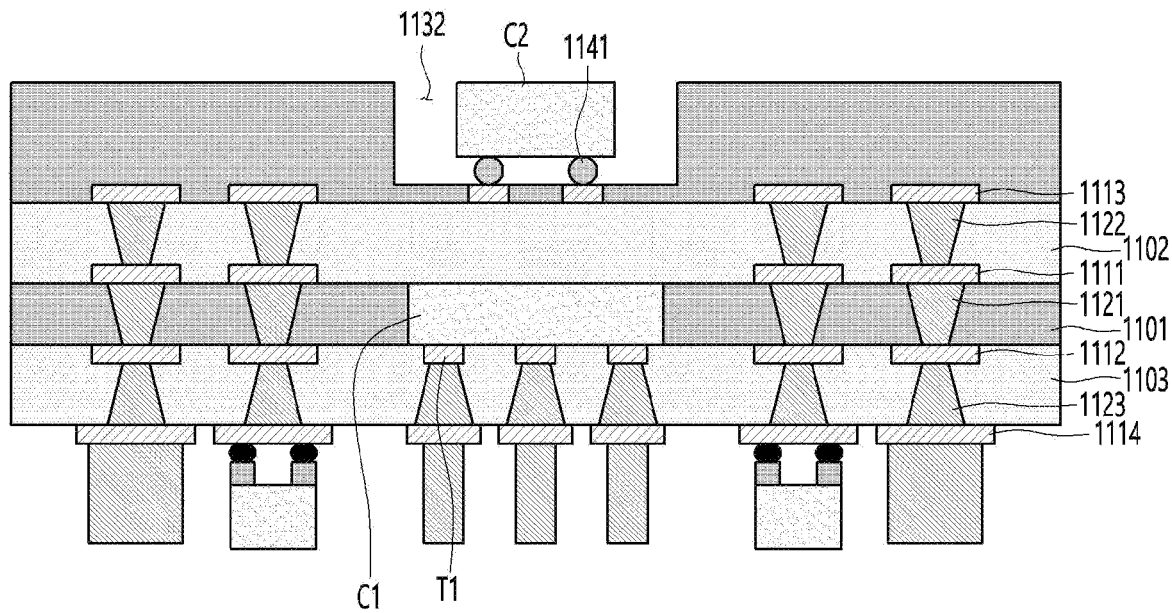
[FIG. 29]
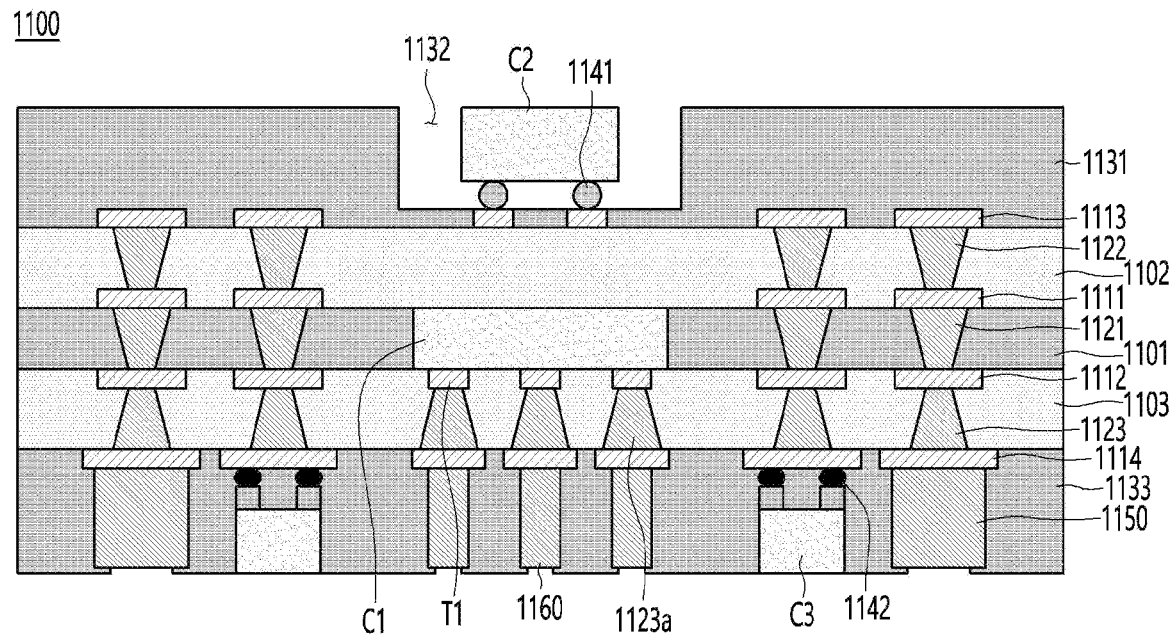

[FIG. 30]
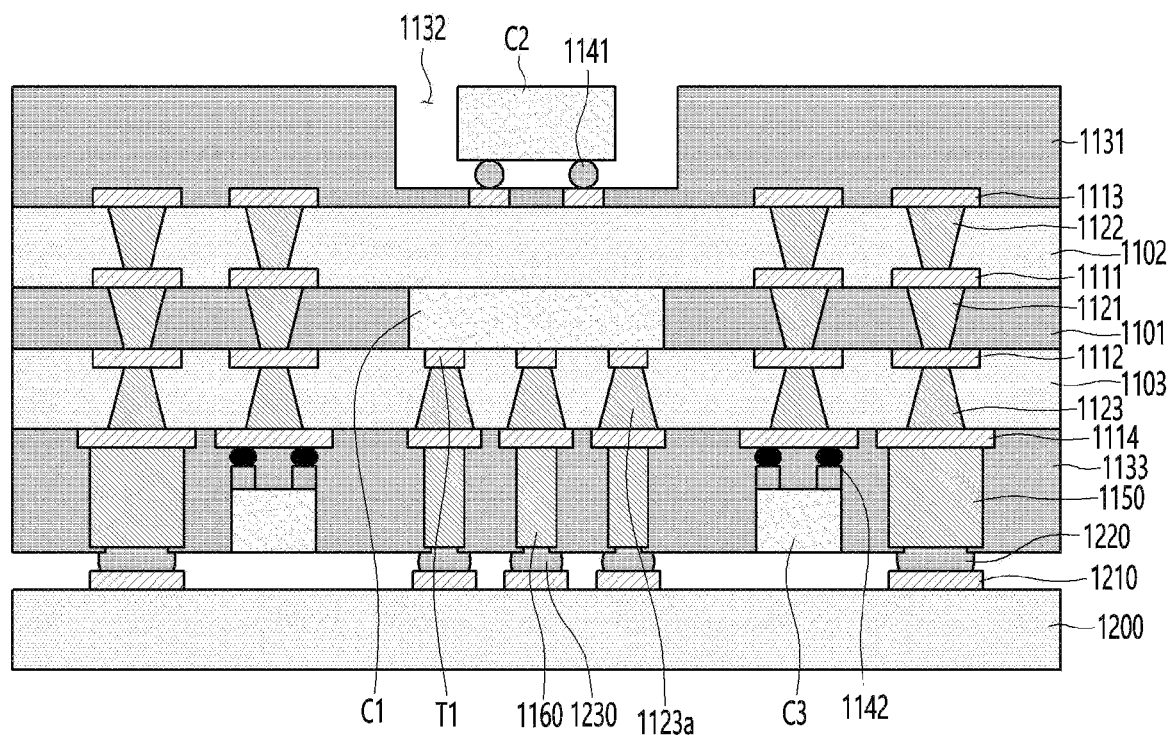

PACKAGE SUBSTRATE

CROSS-REFERENCE TO RELATED PATENT APPLICATIONS

This application is a U.S. National Stage Application under 35 U.S.C. § 371 of PCT Application No. PCT/KR2021/006562, filed May 26, 2021, which claims priority to Korean Patent Application Nos. 10-2020-0063010, filed May 26, 2020 and 10-2020-0070534, filed Jun. 10, 2020, whose entire disclosures are hereby incorporated by reference.

TECHNICAL FIELD

An embodiment relates to a package substrate.

BACKGROUND ART

A line width of a circuit has been miniaturized as miniaturization, weight reduction, and integration of an electronic component are accelerated. In particular, as a design rule of a semiconductor chip is integrated on a nanometer scale, a circuit line width of a package substrate or a printed circuit board on which the semiconductor chip is mounted has been miniaturized to several micrometers or less.

Various methods have been proposed in order to increase the degree of circuit integration of the printed circuit board, that is, to reduce the circuit line width. For the purpose of preventing loss of the circuit line width in an etching step for forming a pattern after copper plating, a semi-additive process (SAP) method and a modified semi-additive process (MSAP) have been proposed.

Then, an embedded trace substrate (hereinafter referred to as "ETS") method for embedding a copper foil in an insulating layer in order to implement a fine circuit pattern has been used in the industry. The ETS method is manufactured by embedding a copper foil circuit in an insulating layer instead of forming the copper foil circuit on a surface of the insulating layer, and thus there is no circuit loss due to etching and it is advantageous for miniaturizing the circuit pitch.

Meanwhile, recently, efforts have been made to develop an improved 5G (5th generation) communication system or a pre-5G communication system in order to meet a demand for wireless data traffic. Here, the 5G communication system uses ultra-high frequency (mmWave) bands (sub 6 GHz, 28 GHz, 38 GHz, or higher frequencies) to achieve high data transfer rates.

In addition, integration technologies such as beamforming, massive multi-input multi-output (massive MIMO), and array antennas have been developed in the 5G communication system in order to reduce a path loss of radio waves and increase a transmission distance of radio waves in the ultra-high frequency band. Antenna systems are relatively large given that they can consist of hundreds of active antennas of wavelengths in these frequency bands.

Since such an antenna and AP module are patterned or mounted on the printed circuit board, low loss on the printed circuit board is very important. This means that several substrates constituting the active antenna system, that is, an antenna substrate, an antenna power feeding substrate, a transceiver substrate, and a baseband substrate, should be integrated into one compact unit.

DISCLOSURE

Technical Problem

The embodiment provides a package substrate having a novel structure and a method of manufacturing the same.

In addition, the embodiment provides a package substrate that is easy to respond to a fine pitch and a method for manufacturing the same.

In addition, the embodiment provides a package substrate capable of minimizing warpage by maintaining the balance of both sides of a circuit board, and a method of manufacturing the same.

In addition, the embodiment provides a package substrate capable of improving a reliability of a connection portion and a method of manufacturing the same.

In addition, the embodiment provides a circuit board including a post bump directly connected to a device embedded in an insulating layer, and a package board including the same.

In addition, the embodiment provides a circuit board that is easy to respond to a fine pitch and a package board including the same.

In addition, the embodiment provides a circuit board capable of minimizing the occurrence of warpage by maintaining the balance of the upper and lower portions, and a package substrate including the same.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A package substrate according to an embodiment includes an insulating layer; a first outer circuit pattern disposed on an upper surface of the insulating layer; a second outer circuit pattern disposed under a lower surface of the insulating layer; a first connection portion disposed on an upper surface of a first-first circuit pattern of the first outer circuit pattern; a first contact portion disposed on the first connection portion; a first device disposed on the first connection portion through the first contact portion; a second contact portion disposed under a lower surface of a second-first circuit pattern of the second outer circuit pattern; a second device attached to the second-first circuit pattern through the second contact portion; and a second connection portion disposed under a lower surface of a second-second circuit pattern of the second outer circuit pattern; wherein the first connection portion is disposed with a first width and a first interval, and wherein the second connection portion is disposed with a second width greater than the first width and a second interval greater than the first interval.

In addition, the package substrate further includes a first solder resist disposed on the upper surface of the insulating layer and including a first opening exposing the first connection portion; and a second solder resist disposed under a lower surface of the insulating layer and exposing the second contact portion and the second connection portion, and wherein the first circuit pattern includes a first-second circuit pattern covered by the first solder resist.

In addition, the package substrate further includes a seed metal layer disposed between the first-first circuit pattern and the first connection portion; wherein the seed metal layer includes: a first portion disposed between the first-first circuit pattern and the first connection portion; and a second portion disposed between the first-second circuit pattern and the first solder resist.

In addition, the seed metal layer is a seed layer of the first-first circuit pattern, the first-second circuit pattern, and the first connection portion.

In addition, the package substrate further includes a first molding layer disposed on the insulating layer and molding the first device; and a second molding layer disposed under the insulating layer to mold the second device and including an opening exposing a lower surface of the second connection portion.

In addition, the second connection portion includes a first post bump; and a second post bump spaced apart from the first post bump and having a width different from that of the first post bump.

In addition, an upper surface of the first outer circuit pattern is positioned on the same plane as the upper surface of the insulating layer, or positioned lower than the upper surface of the insulating layer, and wherein a side surface of the first outer circuit pattern is covered with the insulating layer.

In addition, the first molding layer includes an open region, and wherein the open region exposes the first device.

In addition, the first outer circuit pattern protrudes on the upper surface of the insulating layer and is exposed through the open region of the first molding layer; and a lower surface of the first open region of the first molding layer is positioned higher than a lower surface of the first outer circuit pattern.

In addition, the first open region of the first molding layer includes: a first portion adjacent to the first outer circuit pattern; and a second portion other than the first portion; wherein a height of the first portion is different from a height of the second portion.

Advantageous Effects

According to the embodiment, a first connection portion is formed on a first circuit pattern of a circuit board, not on an UBM (Under Bump Metal) of a first device. In this case, the first connection portion may be formed by electroplating the seed metal layer formed for the electroplating of the first circuit pattern as the seed layer. According to this embodiment, the first connection portion may be formed by using the seed metal layer of the first circuit pattern, and accordingly, a bonding strength between the seed metal layer, the first circuit pattern, and the first connection portion may be improved. In addition, the embodiment may achieve the effect of not having to manage an embedding depth of the first circuit pattern having an ETS (Embedded Trace Substrate) structure by forming the first connection portion on the first circuit pattern. In addition, when assembling a first device and a circuit board, the embodiment may solve non-contact or non-wet issue problem of a comparative example that occurs as the embedding depth of the first circuit pattern is changed.

In addition, the embodiment may reduce an interval of the first connection portion or an interval of the first circuit pattern by not having to manage the embedding depth of the first circuit pattern, and thus it is possible to respond to the fine pitch. In addition, the embodiment can be applied to a fine bump product according to a decrease in a size width or an interval of the first connection part, and thus design freedom can be secured by securing space.

In addition, a first connection portion is disposed on the insulating layer of the embodiment and a second connection portion is disposed under the insulating layer, thus an upper portion and a lower portion of the package substrate can be equally balanced, and accordingly, it is possible to improve a warpage characteristic of the package substrate.

In addition, the embodiment allows the attachment of a device or a main board by the first connection portion and the second connection portion, and accordingly, it is possible to reduce a volume of a product as it is not necessary to secure a collapse height of a solder ball compared to the solder ball bonding method. In addition, the embodiment proceeds to attach the device or the main board using the first connection portion and the second connection portion having higher thermal conductivity than the solder ball. Accordingly, the embodiment may increase the heat transfer characteristics generated by the device or the main board, and thus the heat dissipation characteristics may be improved.

In addition, a package substrate is manufactured by forming a first post bump constituting a second connection portion on the circuit board of the embodiment and attaching a main board using the post bump, and accordingly, it is possible to respond to a fine pitch, thereby maximizing the productivity of a manufacturer.

In addition, the embodiment allows mounting the device on both sides of the circuit board and disposing a molding portion for molding the mounted device, accordingly, it is possible to maintain the balance of the upper and lower portions of the printed circuit board compared to a conventional single-sided molding structure, and accordingly, it is possible to minimize the occurrence of warpage of the circuit board.

In addition, the embodiment allows the device to be mounted on each of both sides of the circuit board, accordingly, all active or passive devices mounted on a conventional upper package can be mounted on the circuit board, thereby reducing an overall thickness of the package board.

In addition, the embodiment allows a lower surface of the molding portion in a lower portion to which the main board is attached to be positioned on the same plane as a lower surface of the device mounted on a lower portion of the circuit board, and it is possible to improve the reliability of the connection between the main board and the circuit board.

In addition, the embodiment allows the connection between the device embedded in the circuit board and the main board by using the second post bump constituting the second connection portion. Accordingly, the embodiment may correspond to a fine pitch by using a plurality of second post bumps corresponding to a pitch of terminals of the embedded device. In addition, the embodiment allows the connection between the device and the main board through the second post bump, thereby improving heat dissipation characteristics. In addition, the embodiment may reduce a signal transmission distance between the embedded device and the main board by connecting the embedded device and the main board through the second post bump, and may improve a transmission speed while improving noise characteristics.

In addition, the embodiment allows the adjustment of the height of the first post bump as much as the height of the device, and thus the design of the package is easy.

In addition, the embodiment enables the formation of the post bumps using the seed layer of the pad without separately forming a seed layer for electroplating the first and second post bumps constituting the second connection portion. Accordingly, it is possible to simplify the manufacturing process by omitting the process of forming a separate seed layer for forming the post bumps, and it is possible to solve the crack generation between the seed layers of the post bumps, and accordingly, the reliability and durability of the product can be improved.

DESCRIPTION OF DRAWINGS

FIG. 1 is a view showing a package substrate of a comparative example.

FIG. 2 is a view showing a package substrate of a first type according to a first embodiment.

FIG. 3 is a view showing a package substrate of a second type according to a first embodiment.

FIG. 4 is a view showing a package substrate of a third type according to a first embodiment.

FIGS. 5 to 15 are views showing a manufacturing method of the package substrate shown in FIG. 4 in order of process.

FIG. 16 is a view showing a printed circuit board according to a second embodiment.

FIGS. 17A and 17B are views showing an open region of a first molding layer of FIG. 16 according to a first embodiment.

FIG. 18 is a view showing an open region of a first molding layer of FIG. 16 according to a second embodiment.

FIGS. 19 to 29 are views showing a manufacturing method of the printed circuit board shown in FIG. 1 in order of process.

FIG. 30 is a view showing a package substrate according to a second embodiment.

BEST MODE

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed as the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more than one) of A (and), B, and C". In addition, the terms such as first, second, A, B, (a), and (b) may be used in describing the elements of the embodiments of the present invention.

These terms are only used to distinguish the elements from other elements, and the terms are not limited to the essence, order, or order of the elements. In addition, when an element is described as being "connected", "coupled", or "connected" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. In addition, when expressed as "on (over)" or "under (below)", it may include not only the upper direction but also the lower direction based on one element.

Hereinafter, an embodiment of the present invention will be described in detail with reference to the accompanying drawings.

FIG. 1 is a view showing a package substrate of a comparative example.

Referring to FIG. 1, the package substrate of the comparative example includes an insulating layer 10, a first circuit pattern 20, a second circuit pattern 25, a via 30, a first solder resist 40, and a second solder resist 45, a first contact portion 50, a second contact portion 55, a device 60, an Under Bump Metal (UBM) 65, and a connection portion 70.

The package substrate of the comparative example includes a circuit board manufactured by an ETS method.

Accordingly, the package substrate includes an insulating layer 10 and circuit patterns respectively disposed on both surfaces of the insulating layer 10.

In this case, the circuit pattern includes a first circuit pattern 20 disposed on one surface of the insulating layer 10 and a second circuit pattern 25 disposed on the other surface of the insulating layer 10. Here, one of the first circuit pattern 20 and the second circuit pattern 25 has a structure embedded in the insulating layer 10.

A via 30 electrically connecting the first circuit pattern 20 and the second circuit pattern 25 is formed in the insulating layer 10.

A first solder resist 40 and a second solder resist 45 are disposed on upper and lower surfaces of the insulating layer 10 to protect the surface of the insulating layer 10, a surface of the first circuit pattern 20 or a surface of the second circuit pattern 25.

In addition, the first solder resist 40 includes an opening (not shown) exposing an upper surface of the first circuit pattern 20, and the second solder resist 45 includes an opening (not shown) exposing a lower surface of the second circuit pattern 25.

Meanwhile, the package substrate of the comparative example includes a device 60 mounted on the first circuit pattern 20. In this case, an under-bump metal (UBM) 65 is formed under a lower surface of the device 60. In addition, a connection portion 70 is formed under the UBM (Under Bump Metal, 65). The connection portion 70 is generally referred to as a copper pillar.

The device 60 is mounted on the package substrate of the comparative example by forming the first contact portion 50 between the first circuit pattern 20 and the connection portion 70 in a state in which the connection portion 70 is formed on the device 60.

That is, the device mounting on the package substrate of the comparative example is accomplished by forming the connection portion 70 on the UBM (Under Bump Metal, 65) of the device 60, not the circuit board, and soldering the connection portion 70 of the device 60 and the first circuit pattern 20 of the circuit board to interconnection through the device attachment process.

However, the structure of the connection portion included in the package substrate of this comparative example may reduce the thickness of the package, but there are many restrictions on the device mounting space during design, and a warpage characteristic is weak.

Specifically, the connection portion 70 of the package substrate of the comparative example is provided at the device 60. At this time, the connection portion 70 as described above is formed on only one side of the package substrate, and the corresponding connection portion is not formed on the other side. That is, the package substrate of the comparative example as described above has an asymmetric structure in which the connection portion is disposed on only one side of the insulating layer 10, which has a weak warpage characteristic due to a balance problem between an upper portion and a lower portion of the package substrate.

In addition, when the device is soldered, the package substrate of the comparative example has a problem in that the mutual contact area decreases according to a degree of embedding of the first circuit pattern 20, and accordingly, a problem in connection reliability with the first contact portion 50 may occur.

In addition, when the contact area between the first circuit pattern 20 and the first contact portion 50 is small, the package substrate of the comparative example has a problem in that the possibility of cracking due to thermal stress or physical damage increases, and thus, a problem in reliability may occur.

Accordingly, the embodiment can provide a package substrate having a novel structure that can solve the reliability problem of the package substrate of the comparative example.

FIG. 2 is a view showing a package substrate of a first type according to an embodiment.

Referring to FIG. 2, a package substrate 100 of a first type includes an insulating layer 110, a first circuit pattern 120, a second circuit pattern 125, a via 130, a seed metal layer 140, and a first solder resist 160, a second solder resist 165, a first connection portion 170, a second connection portion 175, a first contact portion 180, and a second contact portion 185.

In addition, the package substrate 100 of the first type includes a first device 200 and a second device 300 having an under-bump metal (UBM) 210 formed thereon.

Before describing FIG. 2, the package substrate according to the embodiment may have a multilayer structure based on an insulating layer of the circuit board. That is, although the circuit board in FIG. 2 is illustrated as including a single insulating layer, but is not limited thereto. For example, the package substrate of the embodiment may include a circuit board having a stacked structure of a plurality of insulating layers. For example, the insulating layer 110 in the package substrate 100 may have a multilayer structure. In addition, when the insulating layer 110 has a multi-layer structure, a first circuit pattern 120 may be disposed on an upper surface of an uppermost insulating layer among the multi-layered insulating layers, and the second circuit pattern 125 may be disposed under a lower surface of a lowest insulating layer among the multi-layered insulating layers. For example, the first circuit pattern 120 may be referred to as a first outer circuit pattern disposed on an uppermost side or a first outermost side of the circuit board. In addition, the second circuit pattern 125 may be referred to as a second outer circuit pattern disposed on a lowermost side or a second outermost side of the circuit board.

Hereinafter, the insulating layer 110 will be described with the assumption that it is formed in one layer for convenience of description.

A circuit pattern may be disposed on a surface of the insulating layer 110.

For example, a first circuit pattern 120 may be formed on an upper surface of the insulating layer 110. In addition, a second circuit pattern 125 may be formed under a lower surface of the insulating layer 110.

The first circuit pattern 120 may be formed by being embedded in the insulating layer 110. For example, the first circuit pattern 120 may have an Embedded Trace Substrate (ETS) structure. For example, a side surface of the first circuit pattern 120 may be surrounded by the insulating layer 110. For example, an upper surface of the first circuit pattern 120 may be disposed on the same plane as an upper surface of the insulating layer 110 or may be disposed lower than an upper surface of the insulating layer 110. For example, a lower surface of the first circuit pattern 120 may be positioned lower than an upper surface of the insulating layer 110.

The second circuit pattern 125 may be disposed to protrude under the lower surface of the insulating layer 110. That is, an upper surface of the second circuit pattern 125 may directly contact a lower surface of the insulating layer 110. However, the embodiment is not limited thereto, and a seed metal layer (not shown) of the second circuit pattern 125 may be disposed between an upper surface of the second circuit pattern 125 and the lower surface of the insulating layer 110.

That is, the package substrate of the embodiment is manufactured by the ETS method. Accordingly, the first circuit pattern 120 may have a structure embedded in the insulating layer 110, and the second circuit pattern 125 may have a structure protruding from a surface of the insulating layer 110.

The first circuit pattern 120 and the second circuit pattern 125 are wires that transmit electrical signals, and may be formed of a metal material having high electrical conductivity. To this end, the first circuit pattern 120 and the second circuit pattern 125 may be formed of at least one metal material selected from gold (Au), silver (Ag), platinum (Pt), titanium (Ti), tin (Sn), copper (Cu), and zinc (Zn). the first circuit pattern 120 and the second circuit pattern 125 may be formed of a paste or solder paste including at least one metal material selected from gold (Au), silver (Ag), platinum (Pt), titanium (Ti), tin (Sn), copper (Cu), and zinc (Zn) having excellent bonding power. Preferably, the first circuit pattern 120 and the second circuit pattern 125 may be formed of copper (Cu) having high electrical conductivity and a relatively inexpensive price.

Meanwhile, each of the first circuit pattern 120 and the second circuit pattern 125 is configured in plurality. For example, the first circuit pattern 120 may be referred to as a first-first circuit pattern connected to a first connection portion 170. Also, the first circuit pattern 120 may include a first-second circuit pattern covered by the first solder resist 160. For example, the second circuit pattern 125 may include a second-first circuit pattern on which a second contact portion 185 is disposed and a second device 300 is mounted. For example, the second circuit pattern 125 may include a second-second circuit pattern in which a second connection portion 175 is disposed.

A via 130 may be disposed in the insulating layer 110. The via 130 is disposed in the insulating layer 110, and accordingly, circuit patterns disposed on different layers may be electrically connected to each other.

That is, the via 130 may be disposed in the insulating layer 110, and an upper surface thereof may be connected to a lower surface of the first circuit pattern 120, and a lower surface thereof may be connected to an upper surface of the second circuit pattern 125.

The via 130 may be formed by filling the inside of a via hole (not shown) formed in the insulating layer 110 with a metal material.

The metal material forming the via 130 may be any one material selected from copper (Cu), silver (Ag), tin (Sn), gold (Au), nickel (Ni), and palladium (Pd). In addition, the conductive material filling may use any one or a combination of electroless plating, electrolytic plating, screen printing, sputtering, evaporation, ink-jetting and dispensing.

A seed metal layer 140 is disposed on an upper surface of the insulating layer 110.

The seed metal layer 140 may be a seed layer used to form the first circuit pattern 120 by electroplating. Also, the seed metal layer 140 may be a seed layer used to form the first connection portion 170 by electroplating, which will be described later. That is, the seed metal layer 140 may be a seed layer of the first circuit pattern 120 and a seed layer of the first connection portion 170.

That is, the seed metal layer 140 may be disposed between the first circuit pattern 120 and the first connection portion 170. In addition, the first circuit pattern 120 may be formed by performing electroplating using the seed metal layer 140. Also, the first connection portion 170 may be formed by performing electroplating using the seed metal layer 140, which is the same seed layer as the first circuit pattern 120.

The seed metal layer 140 may be formed by a chemical copper plating process. The seed metal layer 140 may have a thin film shape and be formed on an upper surface of the insulating layer 110. However, the embodiment is not limited thereto, and the seed metal layer 140 may be a copper foil layer (not shown) included in a carrier board (not shown) used for manufacturing a circuit board.

In this case, the seed metal layer 140 includes a first portion disposed between the first circuit pattern 120 and the first connection portion 170. A lower surface and an upper surface of the first portion of the seed metal layer 140 may have the same width. For example, a lower surface of the first portion of the seed metal layer 140 may have the same width as an upper surface of the first circuit pattern 120. For example, an upper surface of the first portion of the seed metal layer 140 may have the same width as a lower surface of the first connection portion 170. Accordingly, the first circuit pattern 120, the first portion of the seed metal layer 140, and the first circuit pattern 120 has a pillar shape and may be formed to protrude from an inside of the insulating layer 110 to an outside.

Meanwhile, the seed metal layer 140 may include a second portion disposed between the first circuit pattern 120 and a first solder resist 160. In this case, a width of the general seed metal layer has the same width as a width of the circuit pattern. This is because the seed metal layer is formed by electroplating the circuit pattern, and is removed when the electroplating process of the circuit pattern is completed. That is, the circuit pattern is disposed on the seed metal layer. And, when the formation of the circuit pattern is completed, the seed metal layer in the region where the circuit pattern is not disposed is removed, so that the circuit pattern and the seed metal layer have the same width.

Alternatively, the embodiment allows the formation of the first connection portion 170 using the seed metal layer 140 after the first solder resist 160 is formed. In addition, the seed metal layer in the region where the first solder resist 160 and the first connection portion 170 are not formed is removed after the first connection portion 170 is formed. Accordingly, the second portion of the seed metal layer 140 of the embodiment may have a width different from that of the second circuit pattern 125. That is, a lower surface of the second portion of the seed metal layer 140 is in direct contact with the first circuit pattern 120. In addition, an upper surface of the second portion of the seed metal layer 140 is in direct contact with the first solder resist 160. In this case, the second portion of the seed metal layer 140 may have a width greater than a width of the contacted first circuit pattern 120. In addition, the second portion of the seed metal layer 140 may have the same width as the contacted first solder resist 160, or a width smaller than this. For example, the second portion of the seed metal layer 140 may be formed to be larger than a width of the contacted first circuit pattern 120 and smaller than a width of the contacted first solder resist 160.

As described above, the first circuit pattern 120 and the first connection portion 170 of the embodiment are formed using the seed metal layer 140. Accordingly, the embodiment allows a process for forming a separate seed layer for the first connection portion 170 and a process for removing the separate seed layer to be omitted, thereby simplifying the manufacturing process.

In addition, the embodiment may improve bonding strength between the first circuit pattern 120 and the first connection portion 170 by forming the first connection portion 170 using the seed metal layer 140. That is, the embodiment allows the formation of the first circuit pattern 120 by performing an electroplating process after the seed metal layer 140 is formed. Accordingly, the first connection portion 170 is formed using the seed metal layer 140 as it is as a seed layer. In this case, the comparative example proceeds with a process of forming an additional seed metal layer by performing a chemical copper plating process on the first circuit pattern. In this case, a bonding strength of the seed metal layer formed by the additional process is smaller than a bonding strength between the first circuit pattern 120 and the seed metal layer 140 of the embodiment. In this embodiment, the first circuit pattern 120 having a thickness greater than this is formed after the seed metal layer 140 is formed. On the other hand, this is because the seed metal layer of the comparative example is formed to have a thickness thinner than this after the circuit pattern is formed.

A first connection portion 170 is formed on an upper surface of a first portion of the seed metal layer 140. A plurality of the first connection portions 170 may be formed to be spaced apart from each other at regular intervals on the seed metal layer 140. The first connection portion 170 may be a copper pillar. The first connection portion 170 may be connected to an under-bump metal (UBM) 210 of the first device 200. Accordingly, the first connection portion 170 may be formed on the seed metal layer 140 to have a first width and a first interval. The first width may be the same as a width and an interval of the first circuit pattern 120. For example, the first connection portion 170 may have a first width of 10 μm or less and a first interval of 10 μm or less, and may be disposed on an upper surface of the seed metal layer 140.

A second connection portion 175 may be formed under a lower surface of the second circuit pattern 125. The second connection portion 175 may be disposed in an opening (not shown) of the second solder resist 165 formed under a lower surface of the insulating layer 110. Also, the second connection portion 175 may be formed to have a structure protruding below a lower surface of the second solder resist 165.

The second connection portion 175 may be formed in plurality while being spaced apart from each other at a predetermined interval.

The second connection portion 175 may be disposed to have a second width and a second interval. For example, the second width may be greater than the first width of the first connection portion 170. Also, the second interval may be greater than the first interval of the first connection portion 170.

A first contact portion 180 may be disposed on an upper surface of the first connection portion 170. A second contact portion 185 may be disposed under a lower surface of the second circuit pattern 125.

The first contact portion 180 and the second contact portion 185 may have a circular or elliptical shape, but are not limited thereto.

The first contact portion 180 and the second contact portion 185 may include at least one of copper (Cu), tin (Sn), aluminum (Al), zinc (Zn), indium (In), lead (Pb), antimony (Sb), bismuth (bi), silver (Ag) and nickel (Ni). For example, the first contact portion 180 and the second contact portion 185 may be solder bumps. For example, the first contact portion 180 and the second contact portion 185 may be solder balls, and thus may be melted at a temperature of a reflow process.

A first device 200 may be attached on the first contact portion 180. In addition, a second device 300 may be attached under the second contact portion 185.

In this case, an under-bump metal (UBM) 210 may be formed on a connection surface between the first contact portion 180 and the first device 200. That is, an under-bump metal (UBM) 210 is formed under a lower surface of the first device 200. In addition, the first device 200 may be attached on the first connection portion 170 by performing a soldering process while aligning the position of the UBM (Under Bump Metal, 210) on the first contact portion 180.

According to the embodiment, the first connection portion is formed on the first circuit pattern of the circuit board, not on the UBM (Under Bump Metal) of the first device. In this case, the first connection portion may be formed by electroplating the seed metal layer formed for the electroplating of the first circuit pattern as the seed layer. According to this embodiment, bonding strength between the seed metal layer, the first circuit pattern, and the first connection portion may be improved as the first connection portion is formed using the seed metal layer of the first circuit pattern. In addition, the embodiment may achieve the effect of not having to manage an embedding depth of the first circuit pattern having an ETS (Embedded Trace Substrate) structure by forming the first connection portion on the first circuit pattern. In addition, when assembling a first device and a circuit board, the embodiment may solve non-contact or non-wet issue problem of a comparative example that occurs as the embedding depth of the first circuit pattern is changed.

In addition, the embodiment may reduce an interval of the first connection portion or an interval of the first circuit pattern by not having to manage the embedding depth of the first circuit pattern, and thus it is possible to respond to the fine pitch. In addition, the embodiment can be applied to a fine bump product according to a decrease in a size width or an interval of the first connection part, and thus design freedom can be secured by securing space.

In addition, a first connection portion is disposed on the insulating layer of the embodiment and a second connection portion is disposed under the insulating layer, thus an upper portion and a lower portion of the package substrate can be equally balanced, and accordingly, it is possible to improve a warpage characteristic of the package substrate.

In addition, the embodiment allows the attachment of a device or a main board by the first connection portion and the second connection portion, and accordingly, it is possible to reduce a volume of a product as it is not necessary to secure a collapse height of a solder ball compared to the solder ball bonding method. In addition, the embodiment proceeds to attach the device or the main board using the first connection portion and the second connection portion having higher thermal conductivity than the solder ball. Accordingly, the embodiment may increase the heat transfer characteristics generated by the device or the main board, and thus the heat dissipation characteristics may be improved.

FIG. 3 is a view showing a package substrate of a second type according to an embodiment.

Referring to FIG. 3, the package substrate may further include a molding layer as compared with FIG. 2.

That is, a package substrate 100B of a second type includes a first molding layer 190 and a second molding layer 195.

The first molding layer 190 may be formed on an upper surface of the insulating layer 110 and an upper surface of the first solder resist 160.

The first molding layer 190 may be disposed to cover components disposed on an upper side of the insulating layer 110. That is, the first molding layer 190 may be formed by filling a seed metal layer 140, a first solder resist 160, a first connection portion 170, a first contact portion 180, a first device 200 and an under-bump metal (UBM) 210 disposed on an upper surface of the insulating layer 110.

As described above, the first molding layer 190 may be formed by filling the first solder resist 160.

The second molding layer 195 may be disposed to cover the components disposed below the insulating layer 110. That is, the second molding layer 195 may be formed by filling a second connection portion 175, a second contact portion 185, and a second device 300 disposed under a lower surface of the insulating layer 110. However, the second molding layer 195 may include an opening (not shown) exposing a lower surface of the second connection portion 175.

FIG. 4 is a view showing a package substrate of a third type according to an embodiment.

Referring to FIG. 4, a package substrate may further include a lower substrate as compared with FIG. 3.

That is, a package substrate 100C of a third type may include a third contact portion 410 and a lower substrate 400.

The third contact portion 410 may be a solder ball. The third contact portion 410 may be formed under a lower surface of the second connection portion 175 exposed through an opening of the second molding layer 195.

A lower substrate 400 may be attached under the third contact portion 410. The lower substrate 400 may be a main board, but is not limited thereto.

For example, the lower substrate 400 may be any one of several substrates constituting an active antenna system in the 5G package substrate, that is, an antenna substrate, an antenna feeding substrate, a transceiver substrate, and a baseband substrate.

Hereinafter, a method of manufacturing a package substrate according to an embodiment will be described in order of process.

FIGS. 5 to 15 are views showing a manufacturing method of the package substrate shown in FIG. 4 in order of process.

Referring to FIG. 5, the embodiment preferentially prepares a carrier board (CB), which is a basic material, for manufacturing a circuit board. The carrier board CB may include a carrier insulating layer CB1 and a carrier metal layer CB2 disposed on one surface of the carrier insulating layer CB1. In this case, although it is illustrated that the carrier metal layer CB2 is disposed on only one surface of the carrier insulating layer CB1 in the drawing, the embodiment is not limited thereto. That is, the carrier metal layer may be formed on an upper surface and a lower surface of the carrier insulating layer CB1, respectively, and accordingly, the embodiment may simultaneously manufacture a plurality of circuit boards on both sides of the carrier insulating layer CB1.

Next, referring to FIG. 6, the embodiment proceeds with a process of forming a seed metal layer 140 under the carrier metal layer CB2. The seed metal layer 140 may be formed by a chemical copper plating process, but is not limited thereto.

When the seed metal layer 140 is formed, the embodiment forms a first mask M1 on the seed metal layer 140. And, the embodiment proceeds with a process of forming an open portion (not shown) in the first mask M1 by exposing and developing the first mask M1. The open portion may be formed by exposing a lower surface of the seed metal layer 140 at a position where the first circuit pattern 120 is to be formed.

When the first mask M1 is formed, electroplating the seed metal layer 140 as a seed layer to form a first circuit pattern 120 filling the open portion of the first mask M1 is performed.

Next, referring to FIG. 7, the first mask M1 is removed, and accordingly, the insulating layer 110 covering the first circuit pattern 120 is formed under the seed metal layer 140.

When the insulating layer 110 is formed, the embodiment forms the via 130 in the insulating layer 110. In addition, the second circuit pattern 125 connected to the via 130 is formed under a lower surface of the insulating layer 110.

The second circuit pattern 125 may be disposed to protrude under a lower surface of the insulating layer 110. That is, an upper surface of the second circuit pattern 125 may directly contact a lower surface of the insulating layer 110. However, the embodiment is not limited thereto, and a seed metal layer (not shown) of the second circuit pattern 125 may be disposed between the upper surface of the second circuit pattern 125 and the lower surface of the insulating layer 110.

That is, the package substrate of the embodiment is manufactured by the ETS method. Accordingly, the first circuit pattern 120 may have a structure embedded in the insulating layer 110, and the second circuit pattern 125 may have a structure protruding from a surface of the insulating layer 110.

That is, the via 130 may be disposed in the insulating layer 110, and an upper surface thereof may be connected to a lower surface of the first circuit pattern 120, and a lower surface thereof may be connected to an upper surface of the second circuit pattern 125. The via 130 may be formed by filling the inside of a via hole (not shown) formed in the insulating layer 110 with a metal material.

Next, referring to FIG. 8, a second solder resist 165 is formed under the lower surface of the insulating layer 110. The second solder resist 165 may have an opening for opening a part to be exposed among a lower surface of the second circuit pattern 125.

Next, referring to FIG. 9, a second mask M2 is formed under a lower surface of the second solder resist 165. The second mask M2 may include an open portion (not shown) exposing a lower surface of the second circuit pattern 125 at a position where the second connection portion 175 is to be formed through an exposure and development process.

Then, when the open portion of the second mask M2 is formed, a second connection portion 175 is formed under the lower surface of the second circuit pattern 125 exposed through the open portion.

Next, referring to FIG. 10, the embodiment may proceed with a process of removing the second mask M2 and a process of removing the carrier board CB. An upper surface of the seed metal layer 140 used as the seed layer of the first circuit pattern 120 may be exposed after the removal process of the carrier board CB is performed.

Next, referring to FIG. 11, the embodiment may proceed with a process of forming a first solder resist 160 on the seed metal layer 140. The first solder resist 160 may include an open portion (not shown) for opening a region to be exposed among the upper surface of the seed metal layer 140.

Next, referring to FIG. 12, the embodiment may proceed with a process of forming a third mask M3 on the first solder resist 160 and the seed metal layer 140. In addition, the third mask M3 may include an open portion (not shown) exposing the upper surface of the seed metal layer 140 at a position where the first connection portion 170 is to be formed through an exposure and development process.

In addition, when the open portion of the third mask M3 is formed, electroplating may be performed on the upper surface of the seed metal layer 140 exposed through the open portion to form the first connection portion 170. In this case, the first connection portion 170 may be formed by electroplating the seed metal layer 140 as a seed layer. The seed metal layer 140 was also used as a seed layer of the first circuit pattern 120 as described above. In the embodiment, the first circuit pattern 120 and the first connection portion 170 can be formed on both sides of the seed metal layer 140 as a seed layer.

Next, referring to FIG. 13, the embodiment may proceed with a process of removing the third mask M3 and a process of removing the seed metal layer 140 in a region where the first solder resist 160 and the first connection portion 170 are not formed.

Next, referring to FIG. 14, the embodiment may proceed with a process of attaching a first device 200 by disposing a first contact portion 180 on the first connection portion 170. In addition, the embodiment may proceed with a process of attaching a second device 300 by disposing a second contact portion 185 under the lower surface of the second circuit pattern 125 exposed through the opening of the second solder resist 165.

Next, referring to FIG. 15, the embodiment may proceed with a process of forming the first molding layer 190 and the second molding layer 195.

The first molding layer 190 may be formed on an upper surface of the insulating layer 110 and an upper surface of the first solder resist 160. That is, the first molding layer 190 may be formed by filling a seed metal layer 140, a first solder resist 160, a first connection portion 170, a first contact portion 180, a first device 200 and an under-bump metal (UBM) 210 disposed on an upper surface of the insulating layer 110. As described above, the first molding layer 190 may be formed by filling the first solder resist 160.

The second molding layer 195 may be disposed to cover the components disposed below the insulating layer 110. That is, the second molding layer 195 may be formed by filling a second connection portion 175, a second contact portion 185, and a second device 300 disposed under a lower surface of the insulating layer 110. However, the second molding layer 195 may include an opening (not shown) exposing a lower surface of the second connection portion 175.

In addition, the embodiment may proceed with a process of forming the third contact portion 410 under the lower surface of the second connection portion 175 and a process of attaching the lower substrate 400 using the same.

FIG. 16 is a view showing a circuit board according to a second embodiment.

The circuit board of the first embodiment was manufactured using the ETS method. In contrast, the circuit board according to the second embodiment of FIG. 16 may be manufactured using any one of a Modified Semi Additive Process (MSAP) and a Semi Additive Process (SAP). Accordingly, each circuit pattern disposed on an outermost side of the circuit board of the second embodiment may have a structure protruding from the surface of the insulating layer.

Referring to FIG. 16, the circuit board according to the embodiment includes a first insulating layer 1101, a second insulating layer 1102, a third insulating layer 1103, a first circuit pattern 1111, a second circuit pattern 1112, a third circuit pattern 1113, a fourth circuit pattern 1114, a first via 1121, a second via 1122, a third via 1123, a first device C1, a second device C2, a third device C3, a first post bump 1150, a second post bump 1160, a first contact portion 1141, a second contact portion 1142, a first molding layer 1131 and a second molding layer 1133. The first post bump 1150 and the second post bump 1160 may correspond to the second connection portion 175 of the first embodiment. For example, according to the second embodiment, the second connection portion disposed under a lowermost side of the circuit board may include a plurality of post bumps having different widths.

In the circuit board of the second embodiment, the first insulating layer 1101 may be a core board. In addition, the second insulating layer 1102 and the third insulating layer 1103 may be respectively disposed on and under the first insulating layer 1101. In this case, although the second embodiment is illustrated as having a three-layer structure in a number of the insulating layers, the embodiment is not limited thereto. For example, the number of layers of the insulating layer of the second embodiment may consist of one or two layers, or alternatively, the number of layers of four or more layers may be provided.

A circuit pattern may be disposed on surfaces of the first insulating layer 1101, the second insulating layer 1102, and the third insulating layer 1103. The circuit pattern may include a first circuit pattern 1111, a second circuit pattern 1112, a third circuit pattern 1113, and a fourth circuit pattern 1114.

A first circuit pattern 1111 may be disposed on an upper surface of a first insulating layer 1101. A second circuit pattern 1112 may be disposed under a lower surface of the first insulating layer 1101. A third circuit pattern 1113 may be disposed on an upper surface of a second insulating layer 1102. A fourth circuit pattern 1114 may be disposed under a lower surface of a third insulating layer 1103. A third circuit pattern 1113 may refer to a circuit pattern disposed on an uppermost insulating layer in a stacked structure of the insulating layer of the circuit board. For example, the third circuit pattern 1113 may be referred to as a first outer circuit pattern. Also, the fourth circuit pattern 1114 may refer to a circuit pattern disposed under a lower surface of a lowermost insulating layer in a stacked structure of the insulating layer of the circuit board. For example, the fourth circuit pattern 1114 may be referred to as a second outer circuit pattern disposed on a lowermost insulating layer.

The third circuit pattern 1113 corresponding to the first outer circuit pattern may include a first pad 1113a on which a second device C2 is mounted. The fourth circuit pattern 1114 may include a second pad (not shown) on which a third device C3 is mounted. In addition, the fourth circuit pattern 1114 may include a fourth-first pattern disposed to overlap with a first terminal T1 of the first device C1 in a vertical direction and a fourth-second pattern other than this. In addition, a first post bump 1150, which will be described later, is disposed under a lower surface of a fourth-second pattern among the fourth circuit patterns 1114, and a second post bump 1160 may be disposed under a fourth-first circuit pattern among the fourth circuit pattern 1114.

In this case, the first pad 1113a may correspond to the first circuit pattern 120 on which the device is mounted on the circuit board of the first embodiment. For example, the first connection portion 170 disposed on the upper surface of the first circuit pattern 120 of the first embodiment may be disposed on an upper surface of the first pad 1113a of the second embodiment.

A via is disposed in each of the insulating layers. Specifically, a via may be formed in the first insulating layer 1101, the second insulating layer 1102, and the third insulating layer 1103 passing therethrough.

Specifically, a first via 1121 is disposed in the first insulating layer 1101. The first via 1121 electrically connects a first circuit pattern 1111 disposed on an upper surface of the first insulating layer 1101 and a second circuit pattern 1112 disposed under a lower surface of the first insulating layer 1101.

A second via 1122 is disposed in the second insulating layer 1102. The second via 1122 electrically connects a third circuit pattern 1113 disposed on an upper surface of the second insulating layer 1102 and a first circuit pattern 1111 disposed on an upper surface of the first insulating layer 1101.

A third via 1123 is disposed in the third insulating layer 1103. The third via 1123 electrically connects a second circuit pattern 1112 disposed under a lower surface of the first insulating layer 1101 and a fourth circuit pattern 1114 disposed under a lower surface of the third insulating layer 1103.

A first device C1 is embedded in the first insulating layer 1101. The first device C1 may be embedded in the first insulating layer 1101, and at least a portion thereof may be exposed under a lower surface of the first insulating layer 1101. For example, the first device C1 includes a first terminal T1. In addition, the first terminal T1 of the first device C1 may protrude below the lower surface of the first insulating layer 1101. Accordingly, at least a part of the first terminal T1 of the first device C1 may be covered by the third insulating layer 1103.

For example, an upper surface of the first terminal T1 of the first device C1 may be disposed on the same plane as an upper surface of the second circuit pattern 1112.

Accordingly, the first terminal T1 of the first device C1 may be directly connected to the third via 1123 disposed in the third insulating layer 1103. As described above, the third via 1123 is directly connected to the first terminal T1 of the first device C1 without a separate connection pad connected to the first terminal T1 of the first device C1. Accordingly, the embodiment can minimize the wiring length of the electrical signal transmitted through the first device C1, and it is possible to improve the transmission speed and the noise characteristics.

The first device C1 may be an electronic component such as a chip, and may be divided into an active device and a passive device. In addition, an active device is a device that actively uses a non-linear part, and a passive device means a device that does not use a non-linear characteristic even though both linear and non-linear characteristics exist. In addition, the active device may include a transistor, an IC semiconductor chip, and the like, and the passive device may include a capacitor, a resistor, an inductor, and the like. The passive device may increase a signal processing speed of a semiconductor chip, which is an active device, or perform a filtering function.

A second device C2 is mounted on the second insulating layer 1102. Specifically, the second device C2 is mounted on the first pad 1113a among the third circuit patterns 1113 disposed on an upper surface of the second insulating layer 1102. The second insulating layer 1102 may also be referred to as a first outer insulating layer disposed on a first outermost or an uppermost side of the plurality of insulating layers. In addition, the second device C2 may be disposed on the first outer insulating layer.

Specifically, the first contact portion 1141 is disposed on the first pad 1113a of the third circuit pattern 1113. In addition, the second device C2 is electrically connected to the first pad 1113a through the first contact portion 1141. The first contact portion 1141 may be a solder ball. The first contact portion 1141 may include a material having a heterogeneous material in solder. The solder may be composed of at least one of Sn—Cu, Sn—Pb, and Sn—Ag—Cu. In addition, a heterogeneous material may include any one of Al, Sb, Bi, Cu, Ni, In, Pb, Ag, Sn, Zn, Ga, Cd, and Fe.

A first molding layer 1131 is disposed on the second insulating layer 1102. The first molding layer 1131 is disposed to cover an upper surface of the second insulating layer 1102. Preferably, the first molding layer 1131 is disposed to cover an region of an upper surface of the second insulating layer 1102. For example, a part of the upper surface of the second insulating layer 1102 is in contact with the third circuit pattern 1113. In addition, the remaining part of the upper surface of the second insulating layer 1102 is in contact with the first molding layer 1131.

The first molding layer 1131 may be an epoxy molding compound (EMC), but is not limited thereto.

The first molding layer 1131 includes an open region 1132. Preferably, the first molding layer 1131 includes an open region 1132 that opens a region in which the second device C2 is to be disposed among an upper region of the second insulating layer 1102. In addition, the second device C2 may be mounted on a first pad 1113a of the third circuit pattern 1113 in the open region 1132 of the first molding layer 1131.

A third device C3 is mounted under the third insulating layer 1103. Specifically, the third device C3 is mounted on a second pad (not shown) of the fourth circuit pattern 1114 disposed under the lower surface of the third insulating layer 1103.

Specifically, a second contact portion 1142 is disposed under the second pad of the fourth circuit pattern 1114. In addition, the third device C3 is electrically connected to the second pad through the second contact portion 1142. The second contact portion 1142 may be a solder ball. The second contact portion 1142 may include a material having a heterogeneous material in solder.

A second molding layer 1133 is disposed under the third insulating layer 1103. The second molding layer 1133 is disposed to cover a lower surface of the third insulating layer 1103. The second molding layer 1133 may be formed of an epoxy molding compound (EMC), but is not limited thereto.

The second molding layer 1133 may be formed to expose a lower surface of the third device C3. That is, the second molding layer 1133 may be disposed to cover a side surface and an upper surface of the third device C3. At this time, a terminal (not shown) of the third device C3 is disposed on an upper surface thereof, and accordingly, the second contact portion 1142 and the terminal of the third device C3 may be covered by the second molding layer 1133.

Also, the second molding layer 1133 may be disposed under the third insulating layer 1103 to have a predetermined thickness. In this case, a lower surface of the second molding layer 1133 may be positioned on the same plane as a lower surface of the third device C3. Accordingly, a lower surface of the third device C3 may be exposed to an outside. Accordingly, heat generated in the third device C3 may be radiated to the outside through the exposed portion.

Meanwhile, a lower surface of the second molding layer 1133 may be positioned lower than lower surfaces of a first post bump 1150 and a second post bump 1160. In addition, the second molding layer 1133 is formed to expose lower surfaces of the first post bumps 1150 and the second post bumps 1160. Accordingly, a seating portion, which is an open region of the second molding layer 1133, may be provided on lower surfaces of the first post bump 1150 and the second post bump 1160, and accordingly, the solder ball for connection with the main board can be placed in an accurate position thereafter, and thus reliability can be improved.

A first post bump 1150 and a second post bump 1160 are disposed under the lower surface of the fourth circuit pattern 1114. The first post bump 1150 and the second post bump 1160 may be a connection portion for connection with an external main board.

The first post bump 1150 and the second post bump 1160 may be formed using a plating seed layer (not shown) used to form the fourth circuit pattern 1114. Accordingly, a separate seed layer for forming the first post bump 1150 and the second post bump 1160 may be omitted in an embodiment. Accordingly, the first post bump 1150 and the second post bump 1160 may be disposed in direct contact with the fourth circuit pattern 1114 disposed under the lower surface of the third insulating layer 1103.

That is, a seed layer for electroplating may not be separately formed between the first and second post bumps 150 and 160 and the fourth circuit pattern 1114, and the first post bump 1150 and the second post bump 1160 are formed on the fourth circuit pattern 1114 by using the seed layer formed on the fourth circuit pattern 1114. According to this, the embodiment may omit a separate seed layer for the shape of the post bump, thereby simplifying the manufacturing process. In addition, when forming a separate seed layer for electroplating of the post bump, the embodiment may solve a crack generation problem between the separate seed layer and the post bump, thereby improving reliability and durability of a product.

That is, the second connection portion includes only one post bump in the circuit board of the first embodiment. On the other hand, the second connection portion in the circuit board according to the second embodiment may include the first post bump 1150 and the second post bump 1160 having different widths.

The first post bump 1150 may have a first width W1. For example, the first width W1 of the first post bump 1150 may satisfy a range of 150 µm to 300 µm. For example, the first width W1 of the first post bump 1150 may satisfy a range of 170 µm to 280 µm. For example, the first width W1 of the first post bump 1150 may satisfy a range of 200 µm to 250 µm. When the width of the first post bump 1150 is less than 150 µm, it may not be possible to stably support the main board 1200. In addition, when the width of the first post bump 1150 is greater than 300 µm, a volume of the circuit board in a longitudinal direction may increase.

The second post bump 1160 may have a second width W2. For example, the second width W2 of the second post bump 1160 may satisfy a range of 50 µm to 120 µm. For example, the second width W2 of the second post bump 1160 may satisfy a range of 70 µm to 110 µm. For example, the second width W2 of the second post bump 1160 may satisfy a range of 80 µm to 100 µm. When the width of the second post bump 1160 is smaller than 50 µm, it may not be possible to stably support the main board by the adjacent second post bump. Also, when the width of the second post bump 1160 is greater than 120 µm, a volume of the circuit board in a longitudinal direction may increase.

As described above, a second connection portion connected to the main board in the embodiment is formed using the first post bump 1150 and the second post bump 1160 having different widths. That is, the comparative example provided the second connection portion only with the first post bump, and accordingly, the thickness in the longitudinal direction of the circuit board increased. In contrast, the embodiment forms the second post bump together with the first post bump as well as the first post bump, it is possible to support different main boards depending on the location, and thus to reduce the volume of the circuit board in the longitudinal direction.

The second post bump 1160 may be a bump connected to the first device C1 embedded in the first insulating layer 1101.

For example, the second post bump 1160 may be a bump directly connected to the first terminal T1 of the first device C1 through the fourth circuit pattern 1114 and the third via 1123. For example, the second post bump 1160 may be a bump disposed to overlap the first device C1 in a vertical direction. For example, the second post bump 1160 may be disposed to overlap the first terminal T1 of the first device C1 in the vertical direction.

As described above, the embodiment allows connection between the first device C1 and the main board by using the second post bump 1160. In this case, the first device and the main board of the comparative example were connected using a solder ball. However, there is a limit to the fine pitch correspondence due to the characteristics of the solder balls, and accordingly, it is necessary to secure a space for forming the solder balls by using additional connecting wires.

Alternatively, the embodiment allows the connection between the first device and the main board using the second post bump 1160. Accordingly, the embodiment may correspond to the fine pitch by using a plurality of second post bumps 1160 corresponding to the pitch of the first terminal T1 of the first device C1. In addition, the embodiment allows the connection between the first device C1 and the main board through the second post bump 1160, thereby improving heat dissipation characteristics compared to the comparative example. In addition, the embodiment can reduce the signal transmission distance between the first device C1 and the main board by the connection between the first device C1 and the main board through the second post bump, and accordingly, it is possible to improve the transmission speed while improving the noise characteristics.

Hereinafter, the open region 1132 of the first molding layer 1131 according to the embodiment will be described in detail.

FIG. 17 is a view showing an open region of the first molding layer of FIG. 2 according to a first embodiment, and FIG. 18 is a view showing an open region of the first molding layer of FIG. 2 according to a second embodiment.

In this case, the structure of the first molding layer described below may be equally applicable to the first molding layer 190 shown in FIG. 3.

The open region 1132 of the first molding layer 1131 may open a region in which the second device C2 is to be disposed among an upper region of the second insulating layer 1102.

In this case, the open region 1132 of the first molding layer 1131 may be formed while covering an upper surface of the second insulating layer 1102 and exposing the first pad 1113a.

Accordingly, the upper surface of the second insulating layer 1102 may also be covered in the open region 1132. That is, a general cavity is provided to secure a device mounting region by exposing an upper surface of the second insulating layer as well. Alternatively, the embodiment may allow the open region 1132 to selectively expose the first pad 1113a while covering the upper surface of the second insulating layer 1102, thereby improving reliability.

That is, the first molding layer 1131 includes a first portion forming the open region 1132 and a second portion other than the first portion.

In addition, the first portion may be formed by exposing the first pad 1113a on which the second device C2 is mounted.

An upper surface of the first portion may have a step difference. For example, the first portion of the first molding layer 1131 may form a step difference having different heights according to positions. For example, an upper surface of the first portion of the first molding layer 1131 may have a predetermined surface roughness. In this case, the surface roughness of the upper surface of the first portion of the first molding layer 1131 may be such that the upper surface of the first portion has a predetermined surface roughness by forming the first molding layer 1131 in a state in which a jig is disposed, rather than processing it to have the corresponding roughness through an additional process.

The first portion of the first molding layer 1131 may include a first-first portion corresponding to an edge region and a first-second portion corresponding to an inner region.

In this case, an upper surface S1 of the first-first portion of the first molding layer 1131 may have a different height from an upper surface S2 of the first-second portion of the first molding layer 1131.

For example, a height of the upper surface of the first portion of the first molding layer 1131 may change from the first-first portion to the first-second portion. For example, a height of the upper surface of the first portion of the first molding layer 1131 may decrease as it moves away from an inner wall of the open region 1132.

For example, a depth of the open region 1132 of the first molding layer 1131 may increase from an outside to an inside.

When forming the open region 1132, a rectangular jig can be used, and accordingly, an inner wall of the open region 1132 of the embodiment may be perpendicular to an upper surface of the second insulating layer 1102. Preferably, an upper width and a lower width of the open region 1132 may be the same.

The first-first portion of the first molding layer 1131 may have a second height H2. Also, the first-second portion of the first molding layer 1131 may have a third height H3 smaller than the second height H2.

That is, the first pad 1113a may be formed to have a first height H1 on an upper surface of the second insulating layer 1102. In addition, the first-first portion of the first molding layer 1131 should expose the upper surface of the first pad 1113a, and accordingly, the second height H2 may be smaller than the first height H1 of the first pad 1113a.

Also, the first-second portion of the first molding layer 1131 may have a third height H3 smaller than the second height H2. In this case, the first-second portion having the third height H3 may be disposed closer to the first pad 1113a than the first-first portion having the second height H2.

Meanwhile, as shown in FIG. 17, the upper surfaces S1 and S2 of each of the first-first portion and the first-second portion of the first molding layer 1131 may have the same height in the entire region. For example, the upper surface S1 of the first-first portion of the first molding layer 1131 may be flat. For example, the upper surface S1 of the first-first portion of the first device C1 may have the same height as each other in the entire region. For example, the upper surface S2 of the first-second portion of the first molding layer 1131 may be flat. For example, the upper surface S2 of the first-second portion of the first device C1 may have the same height as tach other in the entire region.

Alternatively, as shown in FIG. 18, the upper surfaces S1 and S2 of each of the first-first portion of the first molding layer 1131 and the first-second portion may have a different height from an outside to an inside.

Meanwhile, the second height H2 may have a level of 95% or less of the first height H1. In this case, the first upper surface S1 of the first portion of the first molding layer 1131 and the second upper surface S2 of the first-second portion of the first molding layer 1131 may have different heights for each position. Accordingly, the second height H2 may mean an average height of the first upper surface S1. Also, alternatively, the second height H2 may mean a largest height value among heights of the first upper surface S1 for each position.

The upper surface S1 of the first-first portion may be lowered from an outside to an inside. For example, the upper surface S1 of the first-first portion may have a greatest height at a portion closest to the inner wall. For example, the upper surface S1 of the first-first portion may have a smallest height at a portion adjacent to the upper surface S2 of the first-second portion.

In addition, the upper surface S2 of the first-second portion may be positioned between the first pad 1113a while having a height smaller than the upper surface S1 of the first-first portion.

In this case, the upper surface S2 of the first-second portion may have a smaller height than the upper surface S1 of the first-first portion. Furthermore, the upper surface S2 of the first-second portion may have different heights according to a position. That is, the upper surface S2 of the first-second portion may have a third height H3 having a different value according to a position.

Preferably, the height of the upper surface S2 of the first-second portion may decrease from an outside to an inside. For example, the upper surface S2 of the first-second portion may have a greatest height at a portion adjacent to an inner side of the first pad 1113a (or a portion adjacent to the upper surface of the first-first portion). In addition, the upper surface S2 of the first-second portion may have the smallest height in the central portion. That is, a cross-section of the upper surface S2 of the first-second portion may have a V-shape in which the height gradually decreases from an outside to an inside. In addition, a cross-section of the upper surface S1 of the first-first portion may have a V-shape in which the height decreases from an outside to an inside. According to the embodiment, when the second device C2 is mounted, the embodiment can solve the connection failure of the second device C2 by not exposing the surface of the first pad 1113a, and accordingly, reliability of the electrical connection between the first pad 1113a and the second device C2 may be improved.

FIGS. 19 to 29 are views showing a manufacturing method of the circuit board shown in FIG. 16 in order of process.

Referring to FIG. 19, the embodiment may preferentially proceed with a process of manufacturing an inner layer substrate.

In order to manufacture the inner layer substrate, the embodiment prepares the first insulating layer 1101. In addition, the embodiment may proceed with a process of forming a first circuit pattern 1111 on an upper surface of the first insulating layer 1101 and a process of forming the second circuit pattern 1112 on the lower surface of the first insulating layer 1101. In addition, the embodiment may proceed with a process of forming a first via 1121 connecting the first circuit pattern 1111 and the second circuit pattern 1112 in the first insulating layer 1101.

Next, referring to FIG. 20, the embodiment may proceed with a process of forming a carrier board CB under the first insulating layer 1101. In addition, the embodiment may proceed with a process of forming a cavity 1101a in the first insulating layer 1101.

Next, referring to FIG. 21, the embodiment may proceed with a process of embedding the first device C1 in the cavity 1101a formed in the first insulating layer 1101. The first device C1 may be embedded in the first insulating layer 1101, and at least a portion thereof may be exposed under a lower surface of the first insulating layer 1101. For example, the first device C1 includes a first terminal T1. In this case, the first terminal T1 of the first device C1 may protrude below the lower surface of the first insulating layer 1101. For example, the first terminal T1 of the first device C1 may be disposed in the carrier board CB. For example, an upper surface of the first terminal T1 of the first device C1 may be disposed on the same plane as an upper surface of the second circuit pattern 1112.

Next, referring to FIG. 22, the embodiment may proceed with a process of forming the second insulating layer 1102 on the upper surface of the first insulating layer 1101. An upper surface of the first device C1 may be covered by the formed second insulating layer 1102.

Next, referring to FIG. 23, the embodiment may proceed with a process of removing the carrier board CB disposed on the lower surface of the first insulating layer 1101. For example, the embodiment may proceed with a process of removing the carrier board CB to expose the second circuit pattern 1112 protruding below the lower surface of the first insulating layer 1101 and the first terminal T1 of the first device C1.

Next, referring to FIG. 24, the embodiment may proceed with a process of forming a third circuit pattern 1113 on the upper surface of the second insulating layer 1102. In addition, the embodiment may proceed with a process of forming a second via 1122 connecting the first circuit pattern 1111 and the third circuit pattern 1113 in the second insulating layer 1102. In this case, the third circuit pattern 1113 formed on the upper surface of the second insulating layer 1102 may include a first pad 1113a for mounting the second device C2.

In addition, the embodiment may proceed with a process of forming the fourth circuit pattern 1114 on the lower surface of the third insulating layer 1103. Also, the embodiment may proceed with a process of forming a third via 1123 connecting the second circuit pattern 1112 and the fourth circuit pattern 1114 in the third insulating layer 1103. In this case, the third via 1123 may include a via directly connected to the first terminal T1 of the first device C1 embedded in the first insulating layer 1101. In addition, the fourth circuit pattern 1114 may include a second pad (not shown) for mounting the third device C3.

Next, referring to FIG. 25, the embodiment may proceed with a process of arranging a mold chase (MC) on the second insulating layer 1102. The mold chase (MC) may include a protrusion (not shown) disposed on a first pad 1113a connected to the second device C2 among the third circuit patterns 1113 disposed on the upper surface of the second insulating layer 1102. That is, the protrusion of the mold chase (MC) may be disposed on the first pad 1113a of the third circuit pattern 1113.

Next, referring to FIG. 26, the embodiment may proceed with a process of forming the first molding layer 1131 by filling the remaining regions except for the protrusion of the mold chase (MC) among an upper region of the second insulating layer 1102.

The first molding layer 1131 may have an open region 1132 corresponding to a protrusion of the mold chase (MC). The first molding layer 1131 in the open region 1132 may be formed to fill a part of a space between the upper surfaces of the second insulating layer 1102 of the protrusion.

Next, referring to FIG. 27, the embodiment proceeds with a process of disposing a first contact portion 1141 on the first pad 1113a exposed through the open region 1132 of the first molding layer 1131. In addition, the embodiment may proceed with a process of mounting the second device C2 on the first pad 1113a using the first contact portion 1141.

In addition, the embodiment may proceed with a process of disposing a second contact portion 1142 under a second pad among the fourth circuit patterns 1114 disposed on the lower surface of the third insulating layer 1103 and a process of mounting the third device C3 using the second contact portion 1142.

Specifically, the open region 1132 of the first molding layer 1131 may open a region in which the second device C2 is to be disposed among the upper regions of the second insulating layer 1102. In this case, the open region 1132 of the first molding layer 1131 may be formed while covering the upper surface of the second insulating layer 1102 and exposing the first pad 1113a.

Accordingly, the upper surface of the second insulating layer 1102 may also be covered in the open region 1132. That is, a general cavity is provided to secure a device mounting region by exposing an upper surface of the second insulating layer as well. Alternatively, the embodiment may allow the open region 1132 to selectively expose the first pad 1113a while covering the upper surface of the second insulating layer 1102, thereby improving reliability.

Next, referring to FIGS. 28 and 29, the embodiment may proceed with a process of forming a first post bump 1150 and a second post bump 1160 constituting the second connection portion under the lower surface of the fourth circuit pattern 1114. In addition, the embodiment may proceed with a process of forming a second molding layer 1133 covering the third device C3 under the third insulating layer 1103 while exposing the lower surface of the first post bump 1150 and the lower surface of the second post bump 1160.

FIG. 30 is a view showing a package substrate according to an embodiment.

Referring to FIG. 30, a third contact portion 1220 in the package substrate of the embodiment may be disposed under the first post bump 1150 and the second post bump 1160 of the circuit board shown in FIG. 16.

In addition, a main board 200 may be attached to an lower side of the circuit board through the third contact portion 1220. In this case, an upper surface of the main mode 200 may include a pad directly connected to the first post bump 1150 and a pad directly connected to the second post bump 1160, respectively.

The second post bump 1160 is disposed to overlap the first device C1 embedded in the first insulating layer 1101 of the circuit board in the vertical direction. That is, the second post bump 1160 may be directly connected to the first device C1 through the third via 1123 and the fourth circuit pattern 1114. Here, the direct connection may mean directly connected to the second post bump 1160 through the third via 1123 and the fourth circuit pattern 1114 in the vertical direction while the signal line connected to the terminal T1 of the first device C1 is not provided in the horizontal direction.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   an insulating structure including a plurality of insulating layers stacked along a vertical direction;
   a connection part disposed under the insulating structure;
   a first semiconductor device disposed under the connection part;
   a first bump layer disposed under the insulating structure and spaced apart from the connection part and the first semiconductor device along a horizontal direction;
   a second bump layer disposed under the insulating structure and spaced apart from the connection part, the first semiconductor device, and the first bump layer,
   wherein the first bump layer overlaps the connection part and the first semiconductor device along the horizontal direction, and
   wherein a width of the first bump layer in the horizontal direction and a width of the second bump layer in the horizontal direction are different from each other.

2. The circuit board of claim 1, wherein the first bump layer is positioned closer to an outer surface of the insulating structure than the connection part and the first semiconductor device.

3. The circuit board of claim 1, wherein a lower surface of the first bump layer and a lower surface of the first semiconductor device have different heights.

4. The circuit board of claim 3, wherein the lower surface of the first bump layer is positioned lower than the lower surface of the first semiconductor device based on a lower surface of the insulating structure.

5. A circuit board comprising:
an insulating structure including a plurality of insulating layers stacked along a vertical direction;
a connection part disposed under the insulating structure;
a first semiconductor device disposed under the connection part;
a first bump layer disposed under the insulating structure and spaced apart from the connection part and the first semiconductor device along a horizontal direction;
a second bump layer disposed under the insulating structure and spaced apart from the connection part, the first semiconductor device, and the first bump layer; and
a second semiconductor device embedded in the insulating structure;
wherein the second bump layer overlaps the second semiconductor device along the vertical direction.

6. The circuit board of claim 5, wherein the second bump layer is located further from an outer surface of the insulating structure than the connection part, the first semiconductor device, and the first bump layer.

7. The circuit board of claim 5, wherein the second bump layer overlaps the first bump layer, the connection part, and the first semiconductor device along the horizontal direction.

8. The circuit board of claim 5, wherein the connection part and the first semiconductor device are disposed between the first bump layer and the second bump layer.

9. The circuit board of claim 5, wherein a width of the first bump layer in the horizontal direction and a width of the second bump layer in the horizontal direction are different from each other.

10. The circuit board of claim 9, wherein the width of the first bump layer in the horizontal direction is larger than the width of the second bump layer in the horizontal direction.

11. The circuit board of claim 1, further comprising:
a second semiconductor device embedded in the insulating structure.

12. The circuit board of claim 11, wherein the second bump layer overlaps the second semiconductor device along the vertical direction.

13. The circuit board of claim 5, further comprising:
a lower embedding insulation layer disposed under the insulating structure and embeds side portions of the first semiconductor device, the connection part, the first bump layer, and the second bump layer.

14. A circuit board comprising:
an insulating structure including a plurality of insulating layers stacked along a vertical direction;
a connection part disposed under the insulating structure;
a first semiconductor device disposed under the connection part;
a first bump layer disposed under the insulating structure and spaced apart from the connection part and the first semiconductor device along a horizontal direction;
an upper embedding insulation layer disposed on the insulating structure and having a cavity; and
a third semiconductor device disposed in the cavity,
wherein the first bump layer overlaps the connection part and the first semiconductor device along the horizontal direction.

15. The circuit board of claim 14, wherein a bottom surface of the cavity is positioned higher than an upper surface of the insulating structure.

16. The circuit board of claim 14, wherein a bottom surface of the cavity is inclined with respect to an upper surface of the insulating structure.

17. The circuit board of claim 14, wherein a height of the bottom surface of the cavity increases toward an inner wall of the cavity based on an upper surface of the structure.

18. The circuit board of claim 14, further comprising:
an upper wiring part disposed on the insulating structure, and
wherein a bottom surface of the cavity is positioned between an upper surface of the upper wiring part and a lower surface of the upper wiring part.

* * * * *